United States Patent [19]
Ono et al.

[11] Patent Number: 5,853,486
[45] Date of Patent: Dec. 29, 1998

[54] TREATMENT SYSTEM AND TREATMENT APPARATUS WITH MULTI-STAGE CARRIER STORAGE CHAMBERS

[75] Inventors: Yuji Ono, Sagamihara; Katsuhiko Mihara, Hachioji, both of Japan

[73] Assignee: Tokyo Electron Kabushiki Kaisha, Tokyo, Japan

[ * ] Notice: The term of this patent shall not extend beyond the expiration date of Pat. No. 5,378,145.

[21] Appl. No.: 620,535

[22] Filed: Mar. 25, 1996

Related U.S. Application Data

[60] Division of Ser. No. 212,884, Mar. 14, 1994, Pat. No. 5,527,390, which is a continuation-in-part of Ser. No. 89,827, Jul. 12, 1993, Pat. No. 5,378,145.

[30] Foreign Application Priority Data

Mar. 19, 1993 [JP] Japan .................................... 5-059847

[51] Int. Cl.$^6$ ................................................. C23C 16/00
[52] U.S. Cl. ......................... 118/719; 118/715; 432/241; 414/940
[58] Field of Search ..................................... 118/715, 719; 432/152, 241; 414/940

[56] References Cited

U.S. PATENT DOCUMENTS

| | | | |
|---|---|---|---|
| 4,815,912 | 3/1989 | Maney et al. | 414/217 |
| 4,826,360 | 5/1989 | Iwasawa et al. | 406/51 |
| 4,963,069 | 10/1990 | Wurst et al. | 414/416 |
| 4,995,430 | 2/1991 | Bonora et al. | 141/98 |
| 5,186,594 | 2/1993 | Toshima | 414/217 |
| 5,217,501 | 6/1993 | Fuse | 432/241 |
| 5,303,671 | 4/1994 | Kondo | 118/719 |
| 5,378,145 | 1/1995 | Ono | 432/152 |
| 5,378,283 | 1/1995 | Ushikawa | 118/719 |
| 5,388,944 | 2/1995 | Takanabe | 414/217 |
| 5,391,035 | 2/1995 | Krueger | 414/217 |
| 5,433,785 | 7/1995 | Saito | 118/719 |
| 5,462,397 | 10/1995 | Iwabuchi | 414/222 |
| 5,527,390 | 6/1996 | Ono | 118/719 |
| 5,639,234 | 6/1997 | Ono et al. | 432/152 |
| 5,645,419 | 7/1997 | Ohsawa et al. | 432/241 |

OTHER PUBLICATIONS

"A cassette transferring system 'auto track'" (Electronic Material pp. 98–104, Mar. 1984).

Primary Examiner—Robert Kunemund
Assistant Examiner—Jeffrie R. Lund
Attorney, Agent, or Firm—Beveridge, DeGrandi, Weilacher & Young, LLP

[57] ABSTRACT

A treatment system is disclosed, which has a treatment apparatus for performing a predetermined treatment for a planar workpiece contained in a carrier, and a first air-tight carrier storage chamber for storing the carrier. The treatment apparatus may also have an air-tight second carrier storage chamber. An inert gas supply pipe and an exhaust pipe are connected to each of the treatment apparatus, the first carrier storage chamber, and the second carrier storage chamber. A open/close valve device is provided for each of the inert gas supply pipes and the exhaust pipes.

8 Claims, 16 Drawing Sheets

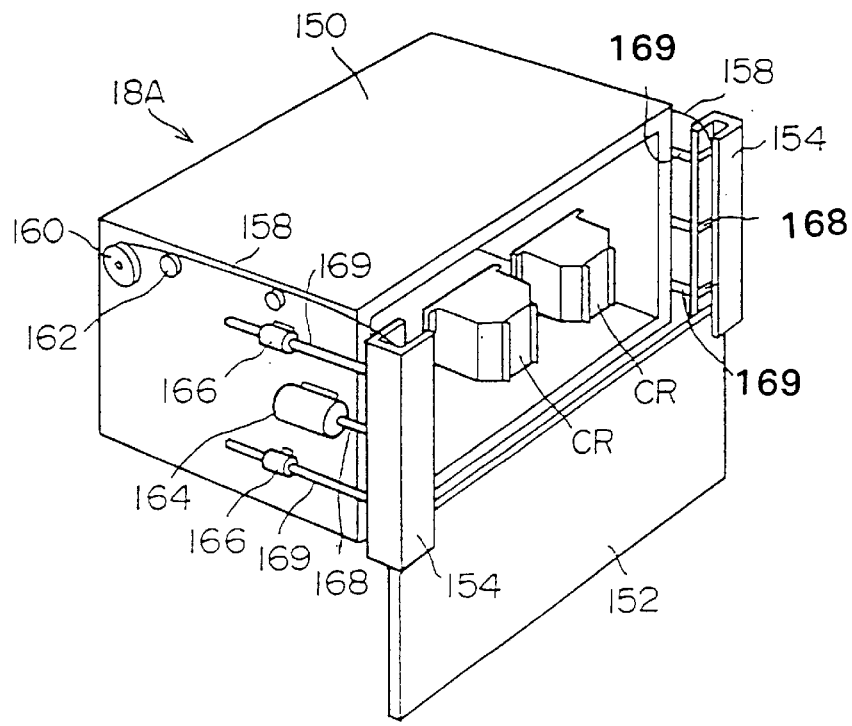
F I G. 10
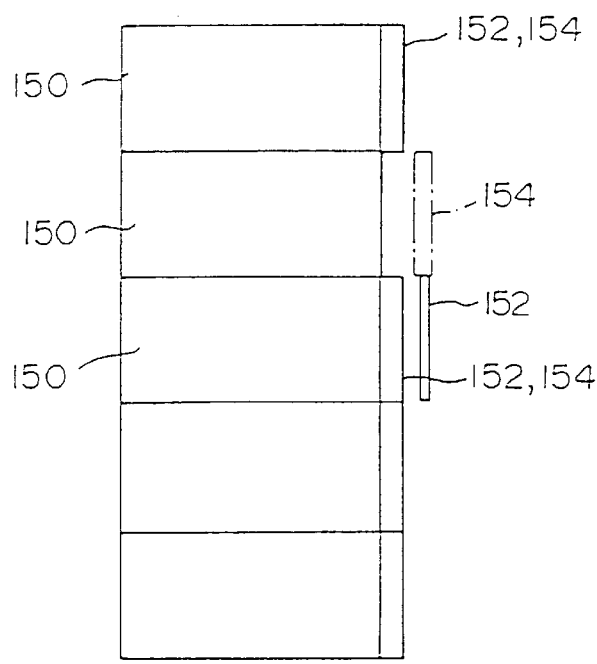
F I G. 11

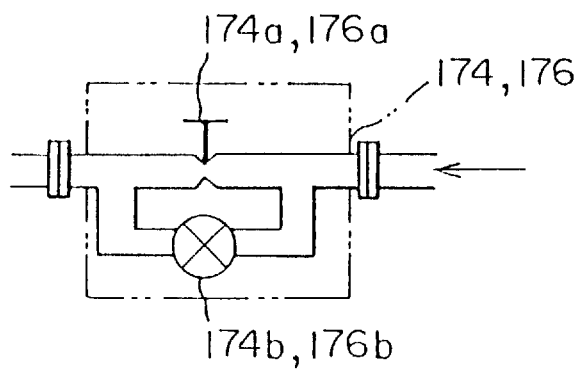
F I G. 14

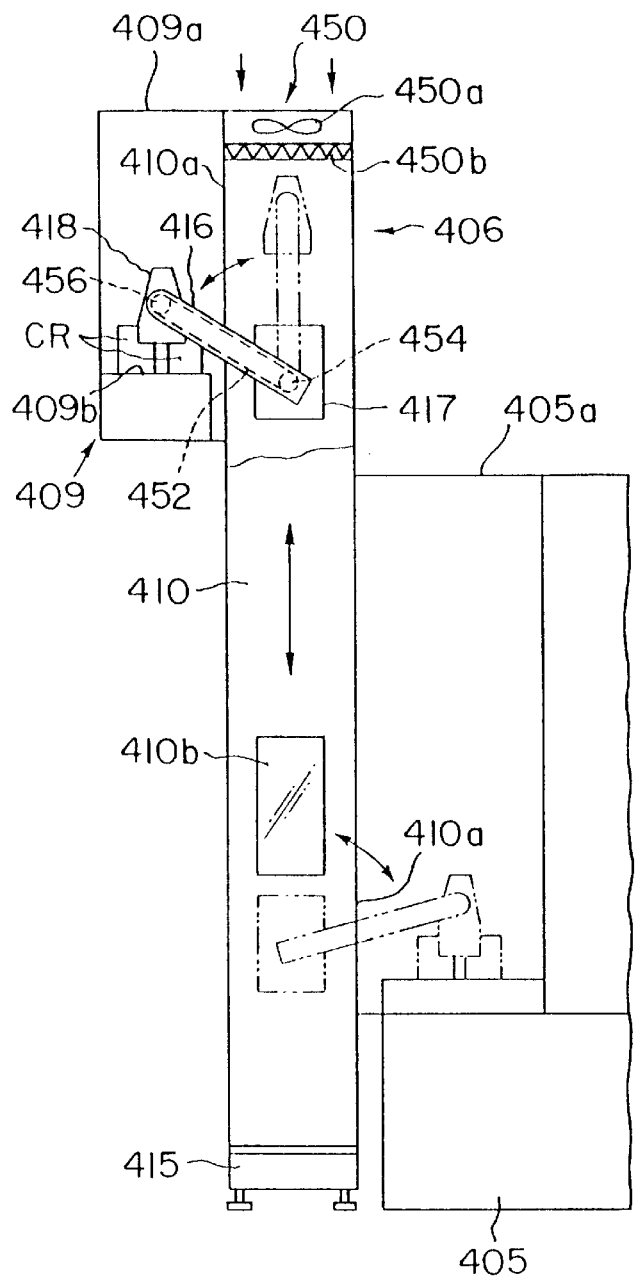
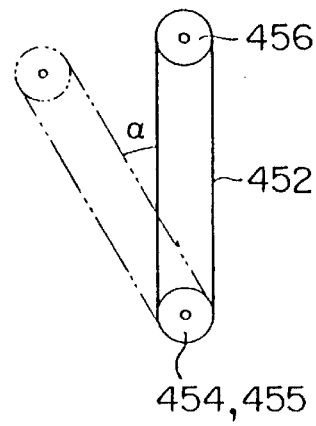
FIG. 16A
FIG. 16B

TREATMENT SYSTEM AND TREATMENT APPARATUS WITH MULTI-STAGE CARRIER STORAGE CHAMBERS

This is a divisional of allowed application Ser. No. 08/212,884 filed on Mar. 14, 1994, now U.S. Pat. No. 5,527,390 which is a continuation-in-part of prior application Ser. No. 08/089,827 filed on Jul. 12, 1993, now U.S. Pat. No. 5,378,145.

BACKGROUND OF THE INVENTION

1. Field for the Invention

The present invention relates to a treatment system for performing a treatment for planar workpieces such as semiconductor substrates and LCD substrates and a treatment apparatus of the same.

2. Description of the Related Art

In semiconductor production process and LCD production process, a container called a carrier, cassette, or the like is used to transfer a plurality of workpieces (such as semiconductor substrates and LCD substrates) at a time so as to improve the productivity.

For example, in a semiconductor production plant, a plurality of (for example, 25) semiconductor wafers which have been lithography treated are contained in a carrier. The carrier is transferred by a transfer robot to a heat treatment apparatus. In a conventional heat treatment apparatus, semiconductor wafers are transferred from a carrier to a wafer boat. A large number of wafers (for example, 100 wafers) are placed on the wafer boat at a time. The wafers on the wafer boat are loaded in a furnace. In the furnace, the wafers are oxidized, diffused, or heat-treated (for example, by CVD method). The wafers which have been heat-treated are transferred from the wafer boat to a carrier. Thereafter, the carrier is transferred to the transfer robot.

Thus, in this heat treatment apparatus, 100 wafers (which are contained in a total of four carriers) are heat-treated at a time. Since the transfer robot transfers one or two carriers at a time, however, carriers which contain wafers which have not been heat-treated are stored on a shelf disposed in the heat treatment apparatus. In a heat treatment system having a plurality of heat treatment apparatuses, a carrier storage chamber which is called a carrier stocker or simply called stocker is additionally provided. This carrier storage chamber stores several dozens of carriers.

Conventionally, clean air is blown to carriers stored on the carrier storage shelf or in the carrier storage chamber so as to prevent particles from adhering to the wafers. However, in the vicinity of the carrier storage shelf and in the carrier storage chamber, molecules of $O_2$ and $H_2O$ in air cause the surfaces of wafers to be oxidized, thereby forming unnecessary natural oxide films. For example, in CVD process for depositing a metal layer, if a natural oxide film is formed on a surface of a row wafer, the film forming characteristics of metal layers deposited thereon adversely fluctuate. Thus, it is undesirable to cause carriers or wafers which are being temporarily stored to be oxidized. Since carriers are stored in the carrier storage chamber for a long time, such unnecessary natural oxide films are very likely formed.

SUMMARY OF THE INVENTION

An object of the present invention is to provide a treatment system for preventing workpieces contained in carriers or transferred therewith from being adversely oxidized or deteriorated.

A first aspect of the present invention is a treatment system, comprising a treatment apparatus for performing a predetermined treatment for a planar workpiece contained in a carrier, a first air-tight carrier storage chamber for storing the carrier, a gas supply means for supplying an inert gas to the first carrier storage chamber, and an gas exhaust means for exhausting a gas from the first carrier storage chamber.

A second aspect of the present invention is a treatment system, comprising a treatment apparatus for performing a predetermined treatment for a planar workpiece contained in a carrier, a first carrier storage chamber for storing the carrier, and a transfer means disposed between the treatment apparatus and the first carrier storage chamber and adapted for transferring the carrier therebetween, wherein the transfer means is disposed in an air-tight transfer chamber, and wherein a gas supply means for supplying an inert gas to the transfer chamber and an exhaust means for exhausting a gas from the transfer chamber are connected to the transfer chamber.

A third aspect of the present invention is a treatment apparatus for performing a predetermined treatment for a planar workpiece contained in a carrier, the treatment apparatus comprising a treatment chamber, a furnace disposed in the treatment chamber and adapted for heat-treating the workpiece contained in the carrier, an second air-tight carrier storage chamber disposed in the treatment chamber and adapted for storing the carrier, a gas supply means for supplying an inert gas to the second carrier storage chamber, and an exhaust means for exhausting a gas from the second carrier storage chamber.

A fourth aspect of the present invention is a treatment apparatus for performing a predetermined treatment for a planar workpiece contained in a carrier, the treatment apparatus comprising an air-tight treatment chamber, a furnace disposed in the treatment chamber and adapted for heat-treating the workpiece contained in the carrier, a second carrier storage chamber disposed in the treatment chamber and adapted for storing the carrier, a gas supply means for supplying an inert gas to the air-tight treatment chamber, and an exhaust means for exhausting a gas from the treatment chamber.

A fifth aspect of the present invention is a treatment system, comprising a treatment apparatus for performing a predetermined treatment for a planar workpiece contained in a carrier, an inter-treatment conveying apparatus disposed above the treatment apparatus and adapted to convey the carrier among treatments apparatus, a carrier lifting apparatus having a carrier holding mechanism for holding said carrier and a lifting mechanism for lifting up and down said carrier holding mechanism for exchanging the carrier with the inter-treatment conveying apparatus, and a carrier transfer apparatus for transferring the carrier between the carrier lifting apparatus and the treatment apparatus, wherein each of the inter-treatment conveying apparatus, the carrier lifting apparatus, and the carrier transfer apparatus has an air-tight chambers and forms a common air-tight space, and wherein clean gas supplying means and air exhausting means are provided at least one of said air-tight chamber, the clean gas supplying means being adapted to supply a clean gas to the air-tight space, the air exhausting means being adapted to exhaust a gas from the air-tight space.

A sixth aspect of the present invention is a carrier lifting apparatus disposed between an inter-treatment conveying apparatus for conveying a carrier containing a planer workpiece and a carrier transfer apparatus for transferring the carrier to a treatment apparatus for treating the workpiece, the carrier lifting apparatus comprising a carrier holding mechanism for holding the carrier, a lifting mechanism for lifting up and down the carrier, and an air-tight chamber for airtightly housing the carrier holding mechanism and the lifting mechanism, the air-tight chamber having clean gas supplying means and air exhausting means.

According to the first aspect of the present invention, the first carrier storage chamber is airtightly constructed, and an inert gas is supplied to the first carrier storage chamber by the inert gas supply means. Atmospheric gases such as $O_2$ gas and $H_2O$ gas in the first carrier storage chamber are exhausted along with the inert gas through the gas exhaust means from the first carrier storage chamber. Thus, a workpiece contained in a carrier stored in the first carrier storage chamber can be prevented from being oxidized or deteriorated.

According to the second aspect of the present invention, the transfer chamber is airtightly constructed, and an inert gas is supplied by the inert gas supply means to the transfer chamber. Atmospheric gases such as $O_2$ gas and $H_2O$ gas in the transfer chamber are exhausted along with the inert gas through the gas exhaust means from the transfer chamber. Thus, a workpiece contained in a carrier which is being transferred in the transfer chamber can be prevented from being oxidized or deteriorated.

According to the third aspect of the present invention, the second carrier storage chamber is airtightly constructed, and an inert gas is supplied to the second carrier storage chamber by the inert gas supply means. Atmospheric gases such as $O_2$ gas and $H_2O$ gas in the second carrier storage chamber are exhausted along with the inert gas through the gas exhaust means from the second carrier storage chamber. Thus, a workpiece contained in a carrier stored in the second carrier storage chamber can be prevented from being oxidized or deteriorated.

According to the fourth aspect of the present invention, the treatment chamber is airtightly constructed, and an inert gas is supplied by the inert gas supply means to the treatment chamber. Atmospheric gases such as $O_2$ gas and $H_2O$ gas in the treatment chamber are exhausted along with the inert gas through the gas exhaust means from the treatment chamber. Thus, a workpiece contained in a carrier which is being transferred in the treatment chamber can be prevented from being oxidized or deteriorated.

According to the fifth aspect of the present invention, an inter-treatment conveying mechanism disposed at a higher place where air purity is relatively high, conveys a carrier among treatments. A carrier lifting apparatus lifts up or down the carrier so as to transfer the carrier to a treatment apparatus such as an upright type heat treatment apparatus. Thus, mobile type conveying robots or workers are not required to convey a carrier among treatments. As a result, the yield and productivity of workpieces can be improved. A common air-tight space formed by air-tight chambers of the inter-treatment conveying apparatus, the carrier lifting apparatus, and the carrier transfer apparatus, is purified by clean gas supplying means and air exhausting means, so that wafers contained within a carrier can be conveyed while they are kept clean.

According to the sixth aspect of the present invention, an air-tight chamber of a carrier lifting apparatus is purified by clean gas supplying means and air exhausting means. Thus, wafers contained within a carrier can be lifted up and downed while they are kept clean.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 10 is a perspective view showing a state where a door of the carrier storage portion of the embodiment is open;

FIG. 11 is a side view schematically showing the relationship of the carrier storage portions when one door thereof is open;

FIG. 14 is a detailed side view showing an open/close device each disposed on a gas supply pipe and an exhaust pipe;

FIG. 16A is a side view showing a carrier lifting apparatus according to the present invention;

FIG. 16B is a schematic view showing a belt disposed on a carrier holding arm;

DETAILED DESCRIPTION OF THE PREFERRED EMBODIMENT

Next, with reference to the accompanying drawings, an embodiment of the present invention will be described.

Figure 1:
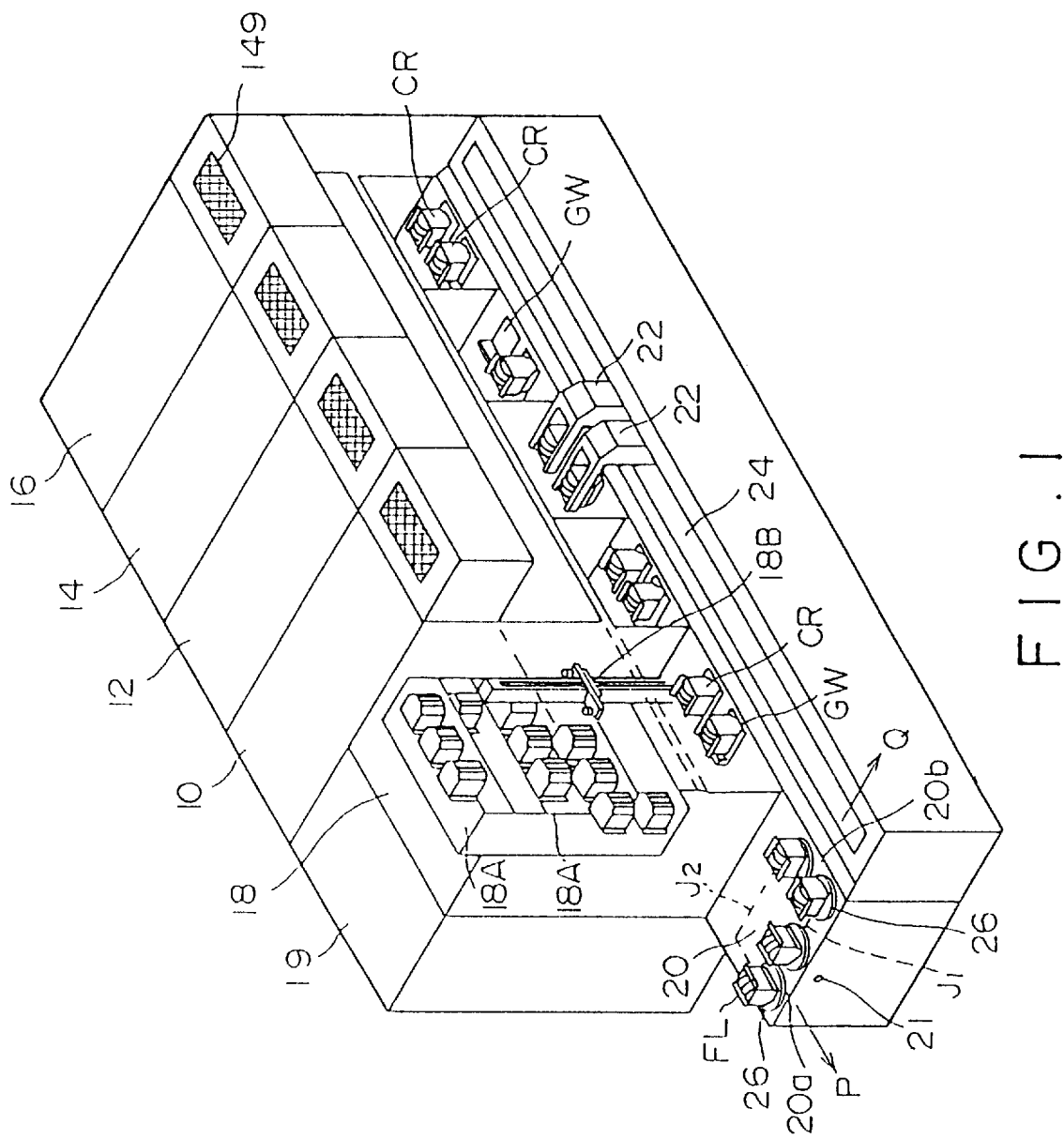
FIG. 1 is a perspective view schematically showing a heat treatment system according to an embodiment of the present invention.

FIG. 1 is a perspective view schematically showing a heat treatment system according to an embodiment of the present invention. As shown in the figure, the heat treatment system comprises a plurality of upright type heat treatment apparatuses (for example, four upright type heat treatment apparatuses 10, 12, 14, and 16), a stocker 18, and an I/O (incoming/outgoing) station 20, a carrier liner 22, and a transfer path 24. The four upright type heat treatment apparatuses 10, 12, 14, and 16 are disposed in line. The stocker 18 and the I/O station 20 are disposed in series with the upright type heat treatment apparatuses 10, 12, 14, and 16. The carrier liner 22 travels on the transfer path 24. The transfer path 24 is disposed straight along the front of each of the heat treatment apparatuses 10, 12, 14, and 16, the stocker 18, and the I/O station 20.

In-the heat treatment system, a plurality of (for example 25) semiconductor wafers W, which are work pieces, are contained in a carrier CR and transferred therewith. In the heat treatment system, the carrier liner 22 transfers two carriers CR among the heat treatment apparatuses 10, 12, 14, and 16, the stocker 18, and the I/O station 20 at a time. The I/O station 20 functions as a carrier entrance/exit of the entire system.

The I/O station 20 has a carrier transfer unit 26 which transfers one or two carriers CR between an external transfer robot (not shown) and the carrier liner 22. The external transfer robot travels near to a first carrier load/unload position 20a at a side edge portion of the I/O station 20. In the first carrier load/unload position 20a, the transfer robot loads or unloads one or two carriers CR to or from the carrier transfer unit 26. At this time, the carrier CR is loaded or unloaded with the orientation of arrow P of FIG. 1. In other words, flange portions FL at the top of the carrier CR are positioned in parallel with the arm of the robot. Below the first carrier load/unload position 20a, an optical communication portion 21 which exchanges optical, communication signals or other means with the transfer robot.

The carrier liner 22 travels near to a second carrier load/unload position 20b on the front of the I/O station 20. In the second carrier load/unload position 20b, the carrier liner 22 loads or unloads one or two carriers CR to or from the carrier transfer unit 26 at a time. At this time, one or two carriers CR are loaded or unloaded with the direction of arrow Q of FIG. 1. In other words, the upper flange portions FL of each carrier CR are positioned in parallel with the longitudinal direction of each arm of the carrier liner 22.

In the I/O station 20, the carrier transfer unit 26 transfers each carrier CR on paths between the first and second carrier load/unload positions 20a and 20b (these paths are denoted by dotted lines J1 and J2). In addition, the carrier transfer unit 26 rotates each carrier CR by around 90°, thereby changing its orientation from the arrow P to the arrow Q or vice versa. Thus, the robot transfers a carrier CR which is oriented in the direction of the arrow P to the carrier transfer unit 26 at the first carrier load/unload position 20. Thereafter, the carrier transfer unit 26 changes the orientations of the carriers CR to the direction of the arrow Q and then transfers them to the carrier liner 22 at the second carrier load/unload position 20b. In contrast, the carrier liner 22 transfers one or two carriers CR which are oriented in the direction of the arrow Q to the carrier transfer unit 26 in the second carrier load/unload position 20b. Thereafter, the carrier transfer unit 26 changes the orientation of the carrier CR to the direction of the arrow P and then transfers it to the transfer robot in the first carrier load/unload position 20a.

As described above, in the heat treatment system, the I/O station 20 is disposed apart from the heat treatment apparatuses 10, 12, 14, and 16. Carriers CR are transferred between the external transfer robot and the carrier transfer unit 26 in the first carrier load/unload position 20a at the side portion of the I/O station 20. In addition, the carriers CR are transferred between the carrier transfer unit 26 and the carrier liner 22 in the second carrier load/unload position 20b on the front of the I/O station 20. Between the first and second carrier load/unload positions 20a and 20b, the orientation of each carrier CR is rotated by around 90°. Thus, it is not necessary to cause the external transfer robot to directly access to the heat treatment apparatuses 10, 12, 14, and 16. Therefore, since the operation of the transfer robot can be simply controlled, the transfer efficiency of the carriers CR is improved. In addition, dust produced by the transfer robot does not affect the heat treatment apparatuses 10, 12, 14, and 16.

Figure 2:
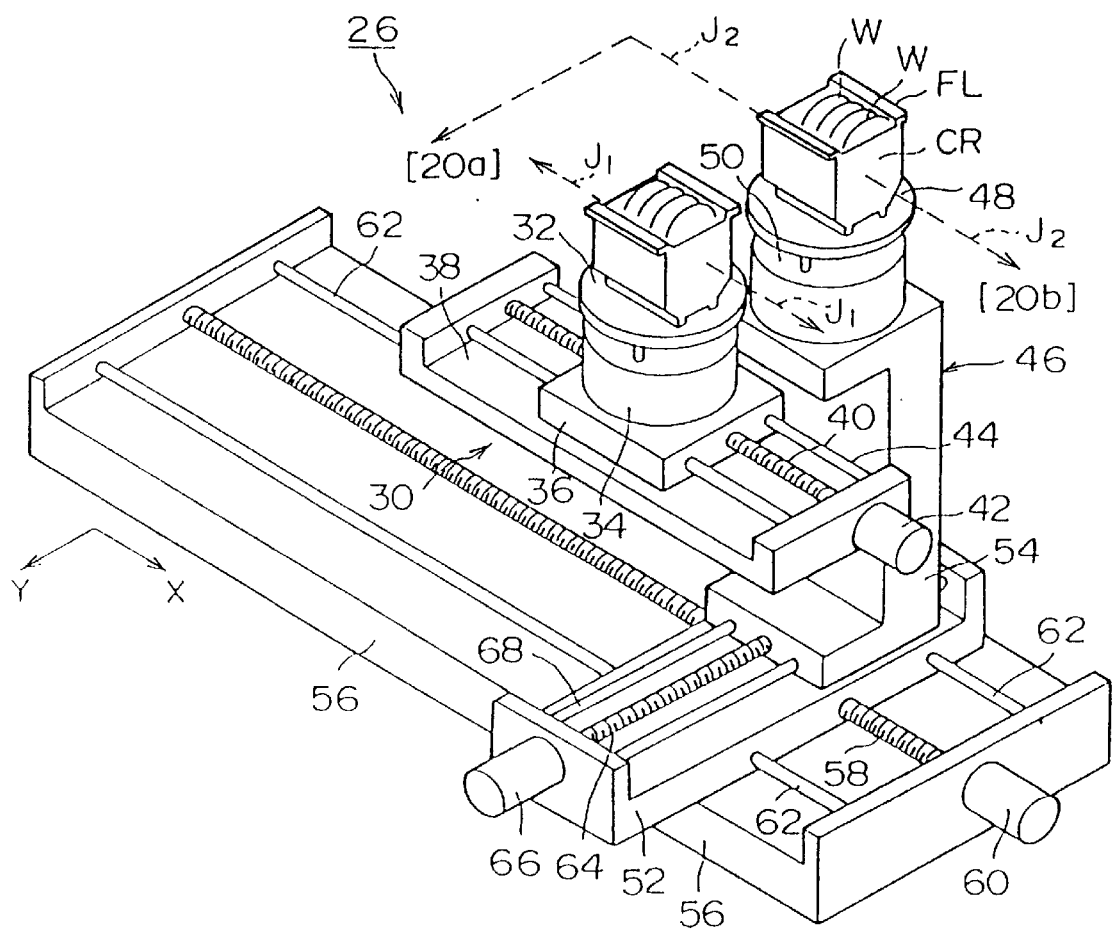
FIG. 2 is a perspective view showing an I/O station of the embodiment.

FIG. 2 shows a practical example of the carrier transfer unit 26. As shown in the figure, the carrier transfer unit 26 comprises a pair of carrier transfer portions 30 and 46. The carrier transfer portions 30 and 46 each transfers a carrier CR.

In the first carrier transfer portion 30 comprises a carrier table 32, a turn table 34, and a carriage 36. The carrier table 32 holds a carrier CR. The turn table 34 rotates the carrier CR. The carriage 36 allows the carrier CR to travel in an X direction (see FIG. 2). The carriage 36 is travelled by a pulse motor 42 through a ball screw 40 along a guide rod 44 disposed between the first and second carrier load/unload positions 20a and 20b. The ball screw 40 extends in the X direction on a base plate 38. The base plate 38 is fixedly supported by a support member (not shown).

The second carrier transfer portion 46 comprises a carrier table 48, a turn table 50, an X carriage 52, and a Y carriage 54. The table 48 holds a carrier CR. The turn table 50 rotates the orientation of the carrier CR. The X carriage 52 allows the carrier CR to travel in the X direction. The Y carriage 54 allows the carrier CR to travel in a Y direction. The X carriage 52 is travelled by a motor 60 through a ball screw 58 along an X guide rod 62 in the X direction between the first and second carrier load/unload positions 20a and 20b. The ball screw 58 extends in the X direction on the base plate 56. The Y carriage is travelled by a pulse motor 66 through a ball screw 64 along a Y guide rod 68 in the Y direction. The ball screw 64 extends in the Y direction on the X carriage 52. Since the Y carriage 54 travels in the Y direction in the vicinity of the first carrier load/unload position 20a, the second carrier transfer portion 46 does not collide with the first carrier transfer portion 30.

Thus, in the carrier transfer unit 26, the first carrier transfer portion 30 transfers a carrier CR on a straight path in the X direction, while the second carrier transfer portion 46 transfers another carrier CR on an L-letter shaped path in the X and Y directions. As a result, the carrier transfer unit 26 can simultaneously transfer two carriers CR between the first and second carrier load/unload positions 20a and 20b without their interference.

Figure 3:
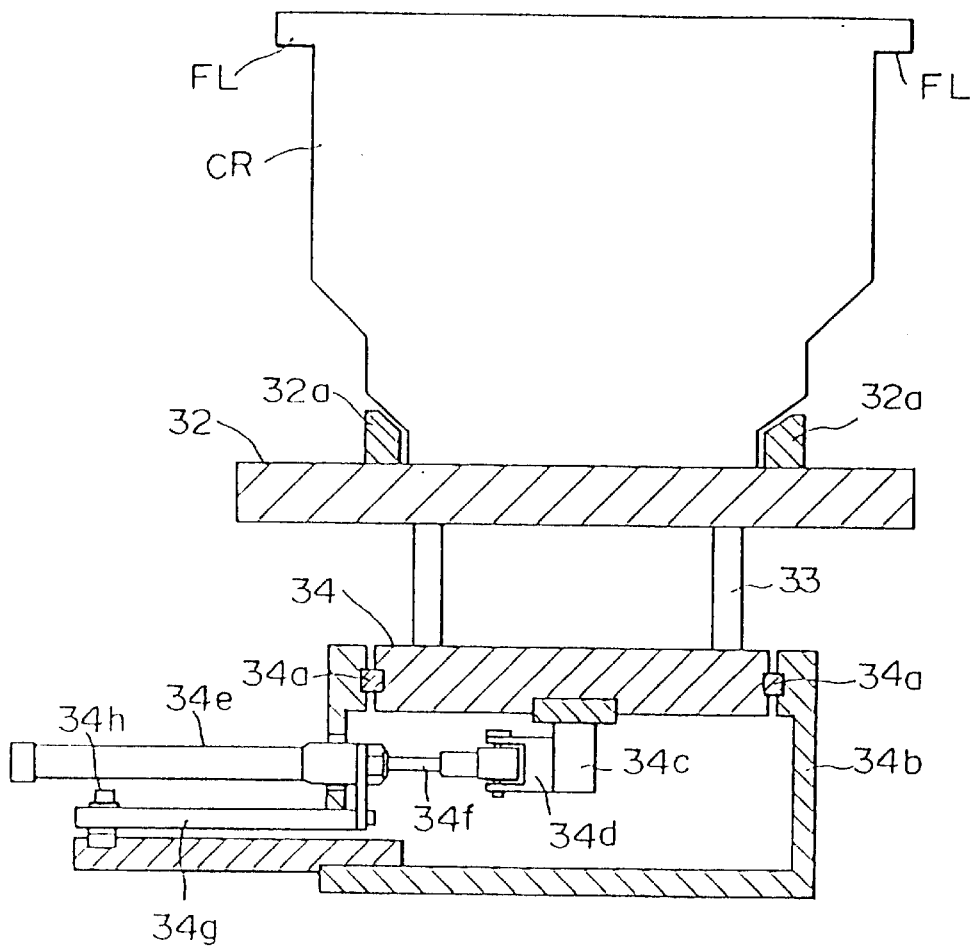
FIG. 3 is a sectional view showing a carrier swinging mechanism of the I/O station of the embodiment.
Figure 4:
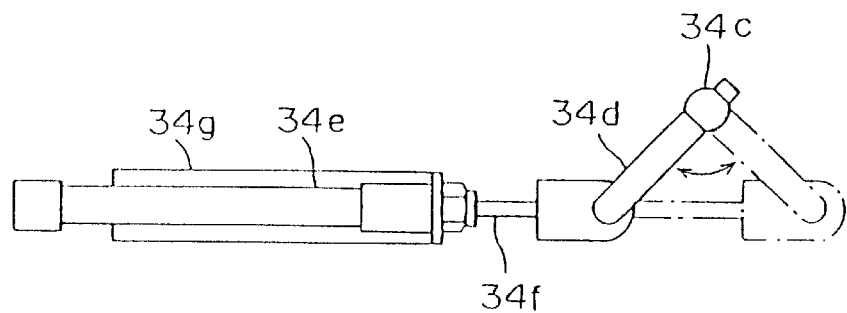
FIG. 4 is a plan view showing a rotation drive portion of the carrier swinging mechanism of FIG. 3.

FIGS. 3 and 4 show the carrier table 32 and the turn table 34 of the first carrier transfer portion 30. As shown in FIG. 3, a pair of protrude portions 32a are disposed on the upper surface of the carrier table 32. Lower portions on both the sides of a carrier CR are held by the protrude portions 32a. The lower surface of the carrier table 32 is connected to a turn table 34 by a plurality of support rods 33. The turn table 34 is rotatably supported by a cylindrical bottomed table housing 34b through a ring-shaped bearing 34a. A center portion of the lower surface of the turn table 34 is connected to an edge portion of a piston rod 34f through a rotation shaft 34c and a joint 34d. The cylinder 34e is rotatably disposed about a rotation shaft 34h through a horizontal support rod 34g. As shown in FIG. 4, when the cylinder 34e causes the piston rod 34f to extend, the rotation shaft 34c and the turn table 34b rotate counterclockwise through the joint 34d. In contrast, when the piston rod 34f retreats, the rotation shaft 34c and the turn table 34b rotate clockwise through the joint 34d. This construction applies to the carrier table 48 and the turn table 50 of the second carrier transfer portion 46.

Next, the construction and operation of the carrier liner 22 according to the embodiment will be described. As shown in FIG. 1, the carrier liner 22 horizontally travels on the transfer path 24 routed straight from end to end of the system along the front portion of each of the heat treatment apparatuses 10, 12, 14, and 16, the stocker 18, and the I/O station 20. When the carrier liner 22 loads carriers CR at the I/O station 20, it transfers the carriers CR to one of the stocker 18, and the heat treatment apparatuses 10, 12, 14, and 16 corresponding to an instruction received from a host computer (which will be described later). The heat treatment system according to this embodiment, the carrier liner 22 is of a double-deck type where a pair of carrier liners 22 are integrally disposed each of which transfer one carrier CR. The carrier liner 22 can transfer two carriers CR in a row at a time.

Figure 5:
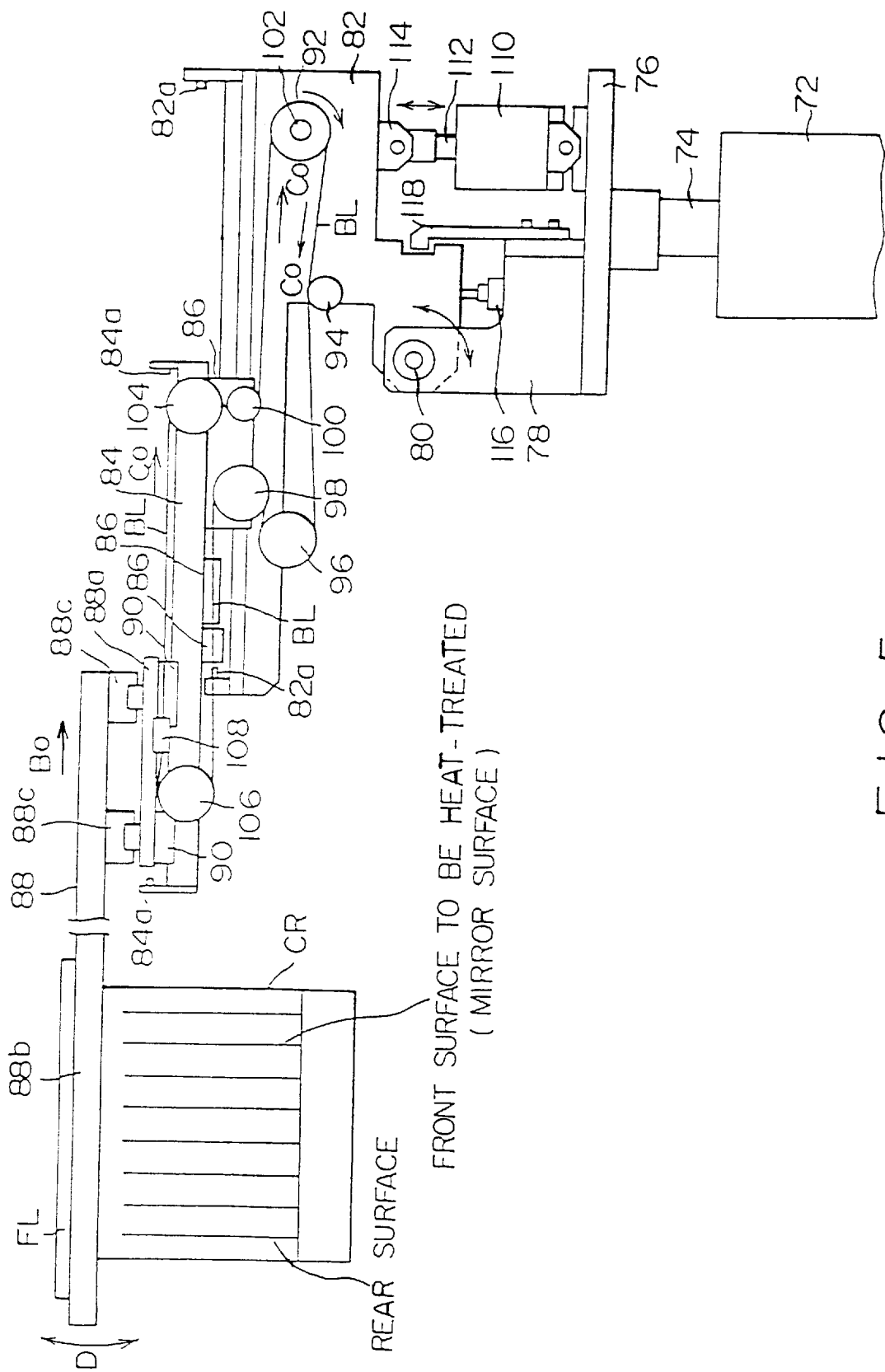
FIG. 5 is a side view showing a carrier liner of the embodiment.
Figure 6:
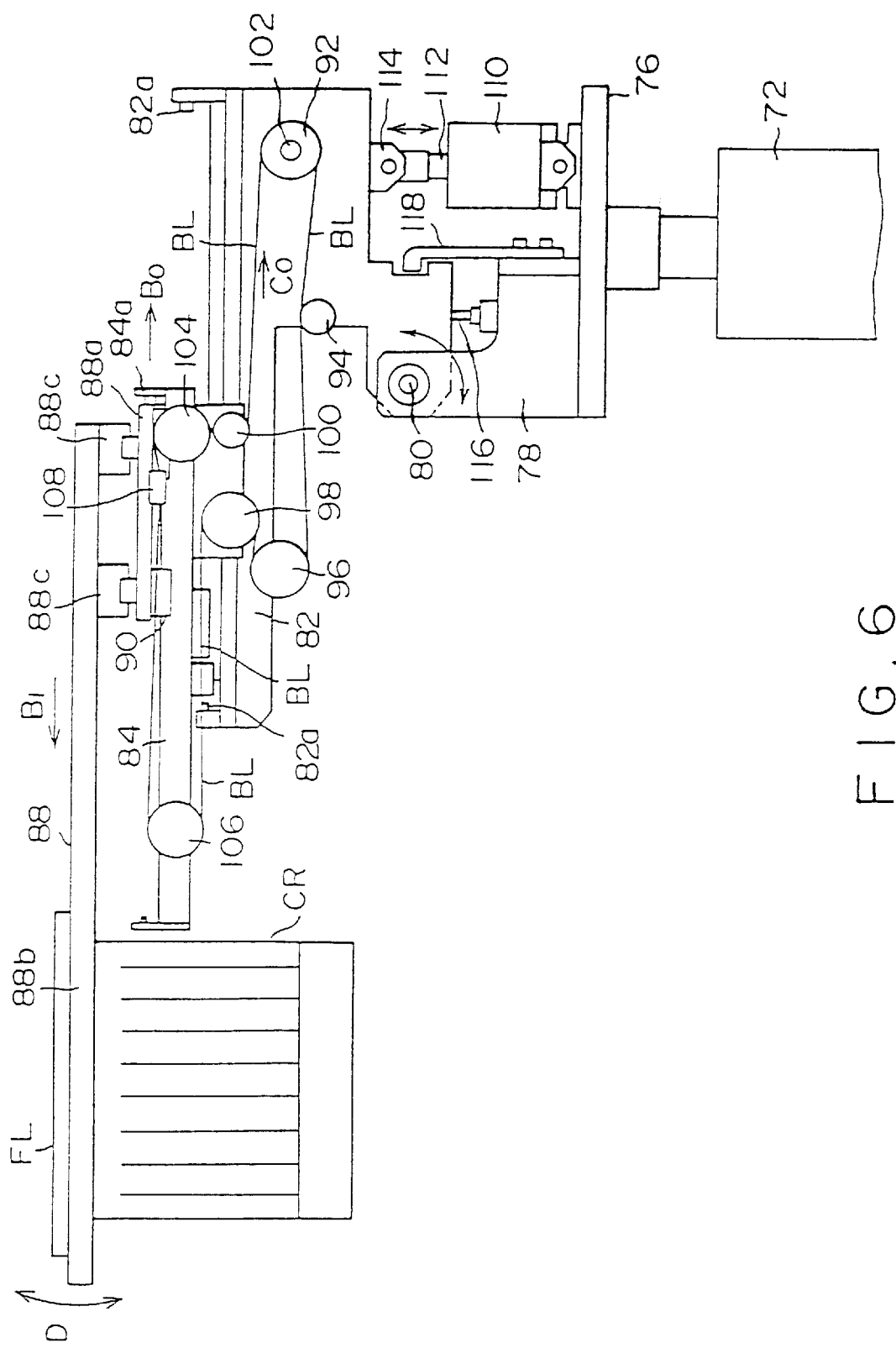
FIG. 6 is a side view showing a state where arms of the carrier liner of the embodiment is contracted to some extent.
Figure 7:
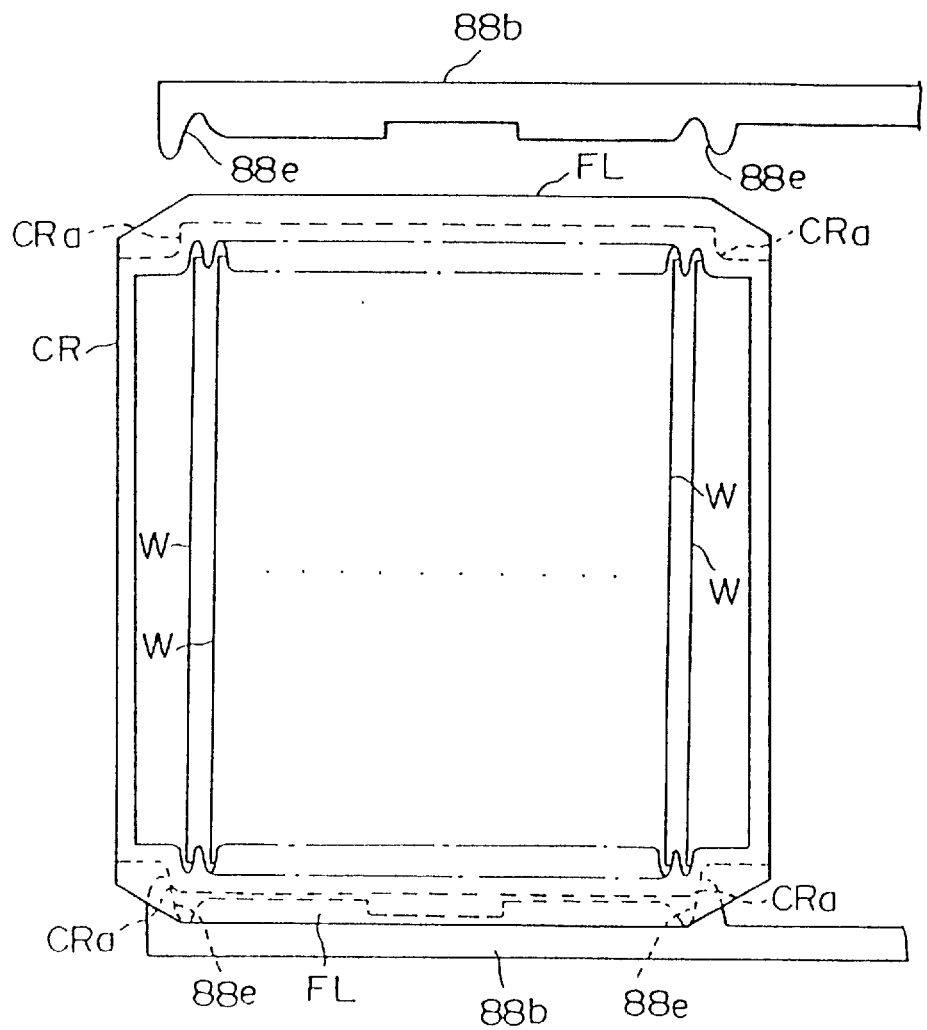
FIG. 7 is a plan view showing both an engagement portion of the carrier and a holding portion of the carrier liner of the embodiment.

FIGS. 5 to 7 show a practical example of the construction of the principal portions of the carrier liner 22. In FIGS. 5 and 6, a base plate 76 is horizontally disposed at an end of a piston rod 74 which extrudes from a cylinder 72 disposed vertically. A vertical support plate 78 is vertically disposed on the base plate 76. An arm support portion 82 is rotatably mounted on the vertical support plate 78 through a rotation shaft 80.

A first arm 84 is slidably mounted on the upper surface of the arm support portion 82 through a slide portion 86 in the longitudinal direction thereof. A second arm 88 is slidably mounted on the upper surface of the first arm 84 through a slide portion 90 in the longitudinal direction thereof.

A pair of stopper members 82a for stopping the first arm 84 are secured to both ends of the upper surface of the arm support portion 82. A pair of stopper members 84a for stopping the second arm 88 are secured to both ends of the upper surface of the first arm 84. The second arm 88 comprises an arm base plate 88a, a pair of carrier holding portions 88b, and an arm open/close device 88c. The arm base plate 88a is secured to the slide portion 90. The carrier holding portions 88b hold the carrier CR. The arm open/close device 88c opens and closes the carrier holding portions 88b.

Three fixed pulleys 92, 94, and 96 are mounted on one side of the arm support portion 82. The fixed pulley 92 is disposed closest to the base plate 76 and connected to a rotation drive shaft 102. Four fixed pulleys 104, 98, 100, and 106 are mounted on one side of the second arm 88. One endless drive belt BL is wound on the seven pulleys 92, 94, 96, 98, 106, 104, 100, and 92 in this order. The drive belt BL is secured to the arm base-plate 88a of the second arm 88 through a clamp member 108.

In the state shown in FIG. 5, when a drive motor (not shown) rotates the drive pulley 92 through the rotation drive shaft 102 clockwise, the drive belt BL runs in the direction of arrow C0 (see FIG. 5). Thus, the second arm 88 moves in the direction of arrow B0 (contracts) through the clamp member 108. When an end of the arm base plate 88a of the second arm 88 comes in contact with the stopper 84a on the base plate 76 side of the first arm 84, the movement (contraction) of the second arm 88 stops as shown in FIG. 6. When the drive pulley 92 is further rotated clockwise, the second arm 88 and the first arm 84 incorporatively move in the direction of arrow B0 (contracts) until the end of the first arm 84 comes in contact with the stopper 82a on the rear end side of the arm support portion 82. In this conditions when the drive pulley 92 is rotated counterclockwise, the above-described operation is reversely performed. In other words, when the drive pulley 92 is rotated counterclockwise, the first and second arms 84 and 88 incorporatively move in the direction of arrow B1 (extend) and then only the second arm 88 moves in the same direction.

As described above, in the carrier liner 22 according to the embodiment, the first and second arms 84 and 88 extend and contract with two steps. Thus, even if the transfer path 24 is narrow, by contacting the arms 84 and 88, carriers CR can be quickly transferred without changing their orientations. In addition, even if a carrier load/unload position of each of the heat treatment apparatuses 10, 12, 14, and 16, the stocker 18, and the I/O station 20 is secluded from the carrier liner 22, by extending the arms 84 and 88, carriers CR can be easily loaded and unloaded.

Moreover, in the carrier liner 22 according to this embodiment, by a carrier inclining mechanism, a carrier CR can be inclined corresponding to the inclined direction of wafers W therein. An air cylinder 110 is vertically disposed at an edge portion of the base plate 76. A piston rod 112 of the air cylinder 110 is connected to the lower surface of an edge portion of the arm support portion 82 through a joint 114.

In the condition where the flange portions FL of a carrier CR are placed in flat position (namely, the wafers W in the carrier CR are placed in upright position), when the piston rod 112 is extended, the arm support portion 82 and the first and second arms 84 and 88 rotate about the rotation shaft 80 counterclockwise. Thus, the forward end side of the carrier holding portion 88b of the second arm 88 lowers and thereby the carrier CR inclines downward. At this time, the wafers W in the carrier CR incline in such a way that the surface under treatment of each of the wafers W faces upward. By contracting the piston rod 112, the above-described operation is reversely performed. In other words, the flange portions FL of the carrier CR is placed in flat position. Thus, the wafers W in the carrier CR are placed in upright position. When the piston rod 112 is further contracted, the arm support portion 82 and the first and second arms 84 and 88 rotate about the rotation shaft 80 clockwise. Thus, the forward end side of the carrier holding portion 88b of the second arm 88 rises and thereby the carrier CR inclines upward. At this time, the wafers W in the carrier CR incline in such a way that the surface under treatment of each of the wafers W face downward. The wafers W are preferably inclined in such a way that the surface under treatment thereof faces downward to some extent. This is because when the wafers W are inclined in such a way, they can prevent adhesion of particles. The vertical support plate 78 has two types of stoppers 116 and 118. The stopper 116 stops the clockwise rotation of a bottom-portion of the arm support portion 82 at a predetermined angle. On the other hand, the stopper 118 stops the counterclockwise rotation of the bottom portion of the arm support portion 82 at a predetermined angle.

As shown in FIG. 7, shoulder portions CRa are defined in the vicinity of both edges of the flange portions FL of the carrier CR. Thus, a total of four shoulder portions CRa are defined on the carrier CR. Protrude portions 88e are defined at the carrier holding portion 88b of the second arm 88 corresponding to the shoulder portions CRa. When the carrier liner 22 holds a carrier CR, the protrude portions 88e on the carrier holding portions 88b are engaged with the corresponding shoulder portions CRa of the carrier CR. Thus, even if the carrier CR is inclined downward, it does not drop from the arm.

As a result, in the carrier liner 22 according to this embodiment, a carrier CR can be inclined in a predetermined range of angles in the direction where the wafers W are inclined. Thus, in the carrier liner 22, the following carrier transfer operation can be performed.

The carrier liner 22 causes the first and second arms 84 and 88 to extend at the I/O station 20 so as to receive a carrier CR. The air cylinder 72 causes the carrier CR to rise to a predetermined height. The air cylinder 110 causes the carrier CR to incline downward by for example 5°. The carrier liner 22 causes the first and second arms 84 and 88 to contract. In this condition, the carrier liner 22 horizontally travels on the transfer path 24 and transfers the carrier CR to one of the heat treatment apparatuses 10, 12, 14, and 16 and the stocker 18. Thereafter, the carrier liner 22 causes the first and second arms 84 and 84 to extend and transfer the carrier CR to an upper portion of a carrier load/unload portion GW of the apparatus or unit. Thereafter, the carrier liner 22 causes the air cylinder 110 to place the arms 84 and 88 and the carrier CR in flat position. Next, the carrier liner 22 causes the air cylinder 72 to lower the carrier CR to the carrier load/unload portion GW (see FIG. 12). Thus, since the carrier liner 22 transfers a carrier CR while wafers W contained therein are inclined by a proper angle, the wafers W come in contact with the wall surfaces of the carrier CR, thereby preventing the wafers W from shaking in the carrier CR. Therefore, occurrence of dust in the carrier CR can be suppressed.

It should be noted that the drive mechanism which horizontally travels the carrier liner 22 along the transfer path 24 may be a conventional drive mechanism using a ball screw or a belt.

Figure 8:
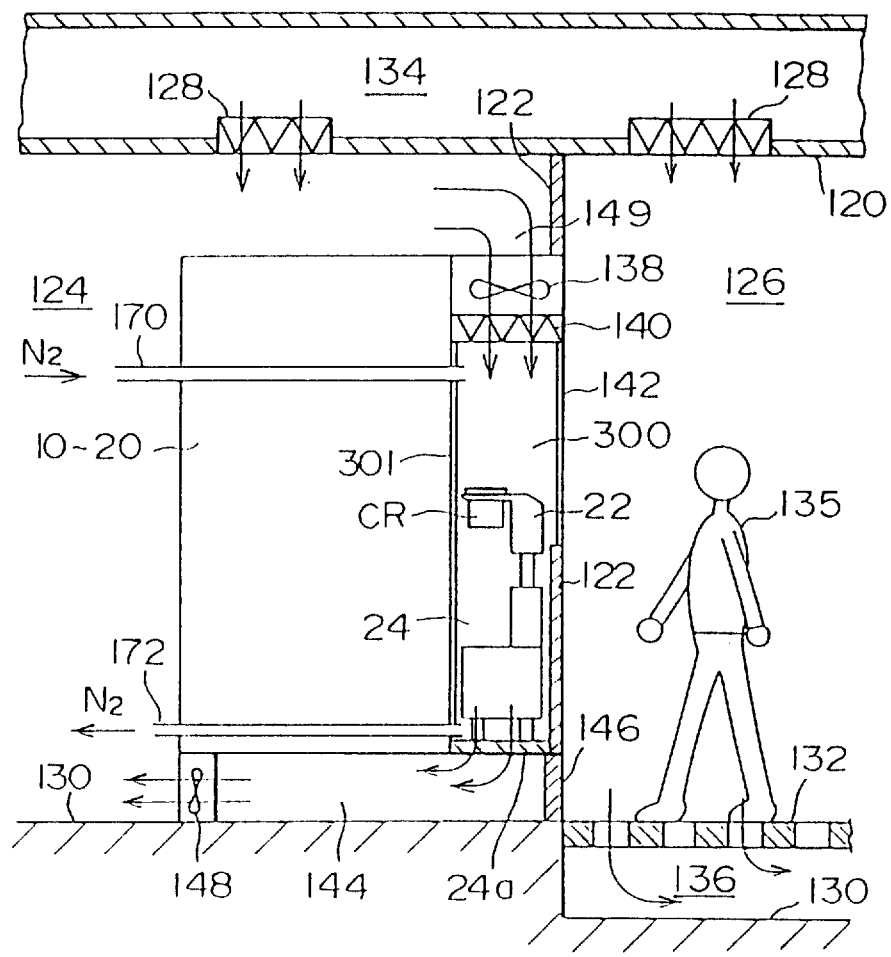
FIG. 8 is a side view schematically showing peripheral portions of a transfer path of a clean room mechanism of the embodiment.

FIG. 8 shows peripheral portions of a transfer means (comprising the carrier liner 22 and the transfer path 24) of a clean room mechanism.

A hanging partition wall 122 mounted on a ceiling 120 partitions a clean room into a treatment room 124 and a work room 126.

In the work room 126, HEPA filters 128 are dispersively disposed on the ceiling 120. A grated panel 132 having a large number of ventilation holes is disposed on a floor 130. First of all, an air conditioner (not shown) supplies air to a supply chamber 134. Then, the air flows to the HEPA filters 128. The HEPA filters 128 purify air. The purified air flows downward to the work room 126 as a down flow. Thereafter, the air flows from the ventilation holes on the grated panel 132 to a return chamber 136 disposed between the grated panel 132 and the floor 130. In the work room 126, the cleanliness of air therein is maintained to, for example, class 100. In this work room 126, a worker 135 operates a control unit (not shown) and so forth.

In the treatment room 124, the heat treatment apparatuses 10, 12, 14, and 16, the stocker 18, and the I/O station 20 which construct the heat treatment system are spaced apart from the floor 130 by a predetermined distance. HEPA filters 128 are also dispersively disposed on the ceiling 120 of the treatment room 124. An air blowing fan 138 and an HEPA filter 140 are disposed at an upper portion on the front side of each of the heat treatment apparatuses 10, 12, 14, and 16, and the stocker 18. The transfer path 24 is isolated from the work room 126 by an anti-static door 142. The anti-static door 142 is made of vinyl chloride. The transfer path 24 is also isolated from the treatment room 124 by an anti-static door 142. The transfer path 24 is disposed in a transfer chamber 300 partitioned off by anti-static doors 142 and 301. A bottom surface 24a of the transfer path 24 has a plurality of ventilation holes. The transfer path 24 is connected to a duct 144 defined at a bottom portion of the system through the ventilation holes. The duct 144 and the work room 126 are partitioned off by a wall plate 146. An air intake fan 148 is disposed at a rear end portion of the duct 144.

Part of purified air flows through the HEPA filter 128 to the treatment room 124. Then, the air flows to the air blowing fan 138 through an air intake opening 149 defined on the upper surface on the front of each of the heat treatment apparatuses 10, 12, 14, and 16, and the stocker 18. The air blowing fan 138 blows air to the HEPA filter 140. Thus, more purified air flows to the transfer path 24. The purified air flows to the duct 144 through the ventilation holes on the bottom surface 24a of the transfer path 24. The air blowing fan 148 disposed on the rear end portion of the duct 144 blows the air to the treatment room 124. Thereafter, the air flows to a return chamber (not shown). The cleanliness of the treatment room 124 is maintained to, for example, around class 10000. An external carrier transfer robot which loads or unloads a carrier CR to or from the I/O station 20 performs a transfer operation in the treatment room 124.

In the heat treatment system according to the embodiment, the transfer means comprising the carrier liner 22 and the transfer path 24 is partitioned off from the work room 126 and the treatment room 124. In addition, purified air downwardly flows to the transfer means. Thus, the purified air lets dust which takes place in a mechanical portion of the carrier liner 22 flow to the duct 144 on the floor side. As a result, the transfer means can be isolated from particles which take place in the work room 126. Moreover, particles which take place in the carrier liner 22 and the transfer path 24 can be effectively suppressed.

In the above-described embodiment, the transfer means having the carrier liner 22 and the transfer path 24 is disposed in the transfer chamber 300, which is partitioned off from the treatment room 124 and the work room 126 by the anti-static doors 142 and 301. Alternatively, the transfer chamber 300 partitioned by the anti-static doors 142 and 301 may be airtightly formed. In this case, an inert gas supply pipe 170 and an exhaust pipe 172 are connected to the transfer chamber 300. An inert gas (for example, $N_2$ gas) is supplied from the inert gas supply pipe 170 to the transfer chamber 300. In addition, the inert gas is periodically exhausted from the exhaust pipe 172. As a result, the interior of the transfer chamber 300 can be always maintained in an inert gas atmosphere.

As with the case shown in FIG. 9 (which will be described later), the inert gas supply pipe 170 and the exhaust pipe 172 shown in FIG. 8 are connected to open/close devices 174 and 176. These open/close devices 174 and 176 are adjusted by a stocker control device 178 in accordance with signals inputted from an O2 concentration detector 180 disposed in the transfer chamber 300.

Next, the function of the stocker 18 according to the embodiment will be described. As shown in FIG. 1, the carrier load/unload portion GW is disposed on the front of the stocker 18. A plurality of (for example, five) first carrier storage chambers 18A are vertically staged behind the carrier load/unload portion GW. A carrier elevator 18B is disposed between the carrier load/unload portion GW and the first carrier storage chambers 18A. A rear chamber 19 is disposed behind the stocker 18. The rear chamber 19 contains a purge mechanism and so forth which will be described later.

In the stocker 18, a carrier CR has two orientations. When a carrier CR is loaded or unloaded to or from the carrier liner 22, the flange portions FL thereof are oriented upward so that wafers W contained therein are placed in upright position. On the other hand, when a carrier CR is stored in a first carrier storage chamber 18A, the flange portions FL thereof are oriented sideward so that wafers W contained therein are placed in flat position. The carrier load/unload portion GW is provided with a carrier orientation changing mechanism. The carrier elevator 18B is provided with a transfer arm (not shown) which loads or unloads a carrier CR to or from each of the first carrier storage chambers 18A.

Figure 9:
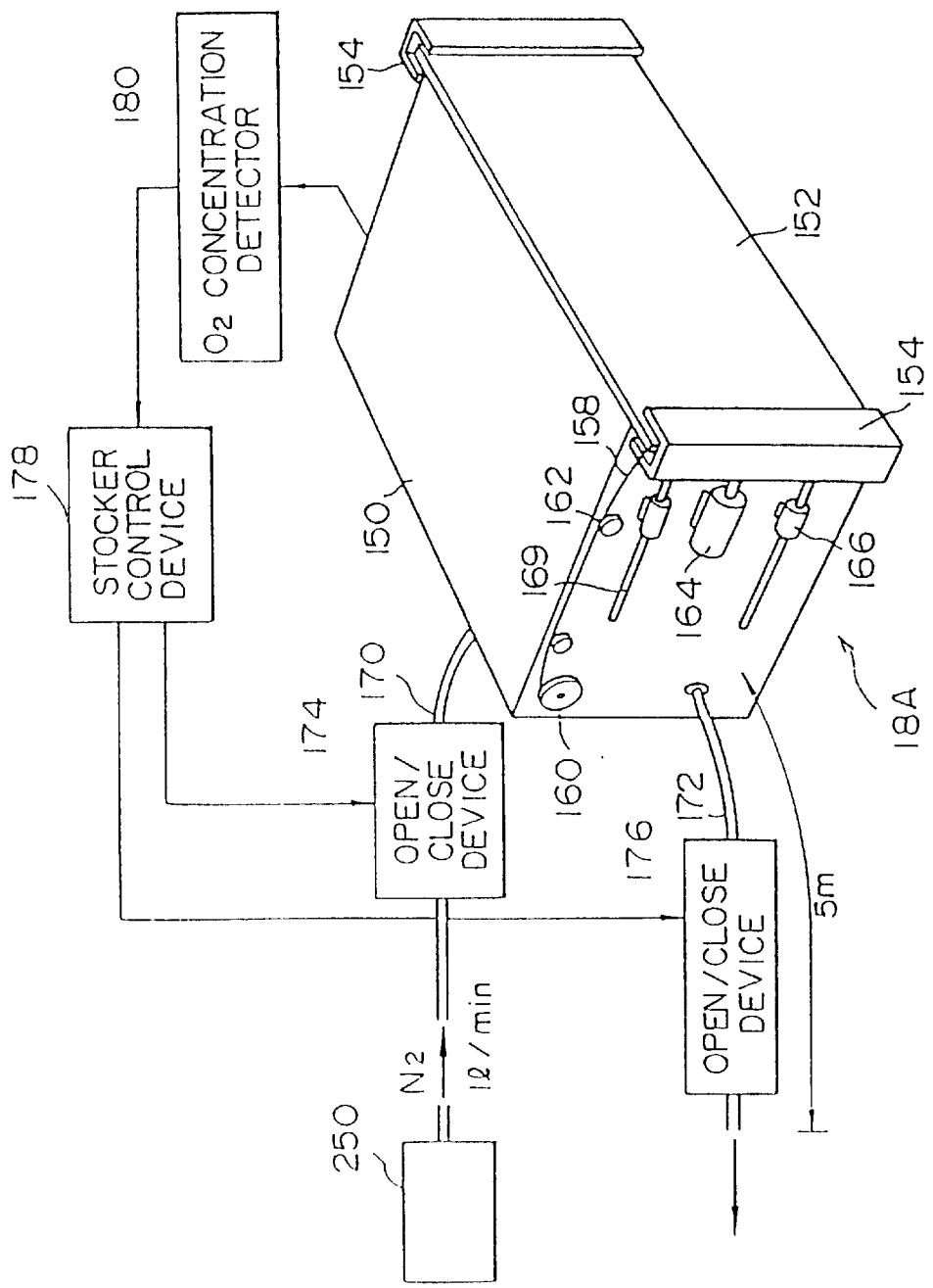
FIG. 9 is a perspective view showing an example of a carrier storage portion of a stocker of the embodiment.

FIGS. 9 and 10 show the first carrier storage chambers 18A of the stocker 18. As shown in FIGS. 9 and 10, each of the first carrier storage chambers 18A has a box-shaped storage chamber main body 150 and a planar door 152. The top, bottom, both sides, and rear of the storage chamber main body 150 are closed with plates, whereas the front thereof is open. The planar door 152 opens or closes the front of the storage chamber main body 150. On each side of the storage chamber main body 150, a bracket-shaped guide 154 is vertically disposed. The bracket-shaped guide 154 slidably holds a side edge portions of the door 152. One end of a cable 158 which supports the weight of the door 152 is secured to an upper edge portion thereof. The other end of the cable 158 is wound around a reel 160 through guide rollers 162. The reel 160 is disposed at a rear portion of the storage chamber main body 150, whereas the guide rollers 162 are disposed between the reel 160 and the upper edge of the guide 154. An air cylinder 164 and two cylindrical linear guides 166 are disposed on each side of the storage chamber main body 150. The air cylinder 164 and the linear guides 166 open and close the door 152. A guide rod 169 passes through one linear guide 166. Another guide rod 169 passes through the other linear guide 166. These guide rods 169 are secured to the rear surface of the door guide 154.

In FIG. 9, when the piston rod 168 of the air cylinder 164 on each side of the storage chamber main body 150 extends to the door 152, the door guide 154 and the door 152 extrude together horizontally from the storage chamber main body 150. Thus, the lower surface of the door 152 is disengaged from the lower edge on each side of the storage chamber main body 150. Next, the reel 160 is rotated in a predetermined direction so as to feed the cable 158. Thus, only the door 152 drops by its dead weight. As a result, as shown in FIG. 10, the front of the storage chamber main body 150 is open. Thus, a carrier CR can be loaded or unloaded from this opening. To close the door 152, the above-described operation is performed in the reverse order. The lower surface of the door 152 is engaged with the lower edge on each side of the storage chamber main body 150. To airtightly close the door 152 of the storage chamber main body 150, a proper sealing material is preferably disposed on the front surface of the storage chamber main body 150.

As schematically shown in FIG. 11, the door 152 which is open in a particular first carrier storage chamber 18A moves ahead of the door 152 of the just lower adjacent first carrier storage chamber 18A. Since the carrier transfer arm of the carrier elevator 18B accesses only one carrier storage chamber 18A at a time, the door 152 of the just lower first carrier storage chamber 18A is closed. Thus, the door 152 of the just upper adjacent first carrier storage chamber 18A does not interfere with the just lower first carrier storage chamber 18A. As a result, the above-described door open/close mechanism allows the installation space of the plurality of first carrier storage chambers 18A vertically staged to be reduced. Therefore, the size of the stocker 18 can be reduced.

The stocker 18 is provided with a purge mechanism. The purge mechanism purges the inside of each first carrier storage chamber 18 of a gas therein by using an inert gas so as to prevent wafers W contained in a carrier CR from being oxidized. As shown in FIG. 9, each first carrier storage chamber 18A is connected to the inert gas supply pipe 170 and the exhaust pipe 172. The inert gas supply pipe 170 and the exhaust pipe 172 are provided with the open/close devices 174 and 176, respectively. As shown in FIG. 14, the open/close device 174 comprises an orifice 174a and an open/close valve 174b which is disposed in parallel therewith. The open/close device 176 comprises an orifice 176a and an open/close valve 176b which is disposed in parallel therewith. Each of the open/close valves 174b and 176b is a solenoid valve which is turned on and off by the stocker control device 178. Each first carrier storage chamber 18A is provided with an $O_2$ sensor which detects the concentration of $O_2$ gas within the first carrier storage chamber 18A. An $O_2$ concentration detector 180 is disposed outside the first carrier storage chamber 18A. The $O_2$ concentration detector 180 detects an $O_2$ concentration value corresponding to an output signal of the $O_2$ sensor. The $O_2$ concentration value is sent to the stocker control device 178.

When a carrier CR is loaded or unloaded, if the concentration of $O_2$ in each first carrier storage chamber 18A exceeds a predetermined value, the stocker control device 178 turns on the open/close valves 174b and 176b. Thus, an inert gas (for example, $N_2$ gas) supplied from an inert gas supply source 250 is supplied to the first carrier storage chamber 18A through the gas supply pipe 170. The flow rate of the inert gas is, for example, 1 liter/min. Thus, an $O_2$ gas and a $H_2O$ gas in the first carrier storage chamber 18A are exhausted along with the inert gas to the exhaust pipe 172. When the concentration of the $O_2$ gas in the first carrier storage chamber 18A decreases to the predetermined value or below, the stocker control device 178 turns off both the open/close valves 174b and 176b.

As shown in FIG. 9, one end of the exhaust pipe 172 is connected to the first carrier storage chamber 18A, while the other end thereof is open to the outside. The length of the exhaust pipe 172 is in the range from 1 to 10 m (for example, approximately 5 m). The open/close devices 174 and 176 have variable orifices 174a and 176a, respectively, which are used for mass flow meters, flow meters, or the like. Thus, when the concentration of the $O_2$ gas decreases to the predetermined value, the orifices 174a and 176a are opened and a small amount of the $N_2$ gas is supplied so as to maintain the concentration of the $O_2$ gas in the first carrier storage chamber 18A. Thus, the consumption of $N_2$ gas is reduced. In addition, the increase of inner pressure is prevented.

As described above, in the stocker 18 according to this embodiment, each first carrier storage chamber 18A is purged of unnecessary gases such as $O_2$ gas and $H_2O$ gas by using an inert gas. The purged gases are exhausted to the outside of the carrier storage chamber 18A. Thus, the wafers W contained in a carrier CR can be prevented from being oxidized or deteriorated. As a result, since the wafers W which are free from a neutral oxide film are transferred from the stocker 18 to each of the heat treatment apparatus 10, 12, 14, and 16, the wafers W can be properly heat-treated.

In the above-described embodiment, an inert gas was supplied corresponding to the atmospheric gases in each first carrier storage chamber 18A by using the $O_2$ concentration detector 180, the open/close valves 170b and 172b, and so forth. Alternatively, the inert gas may be intermittently or continuously supplied at a proper pressure and a proper flow rate.

Figure 12:
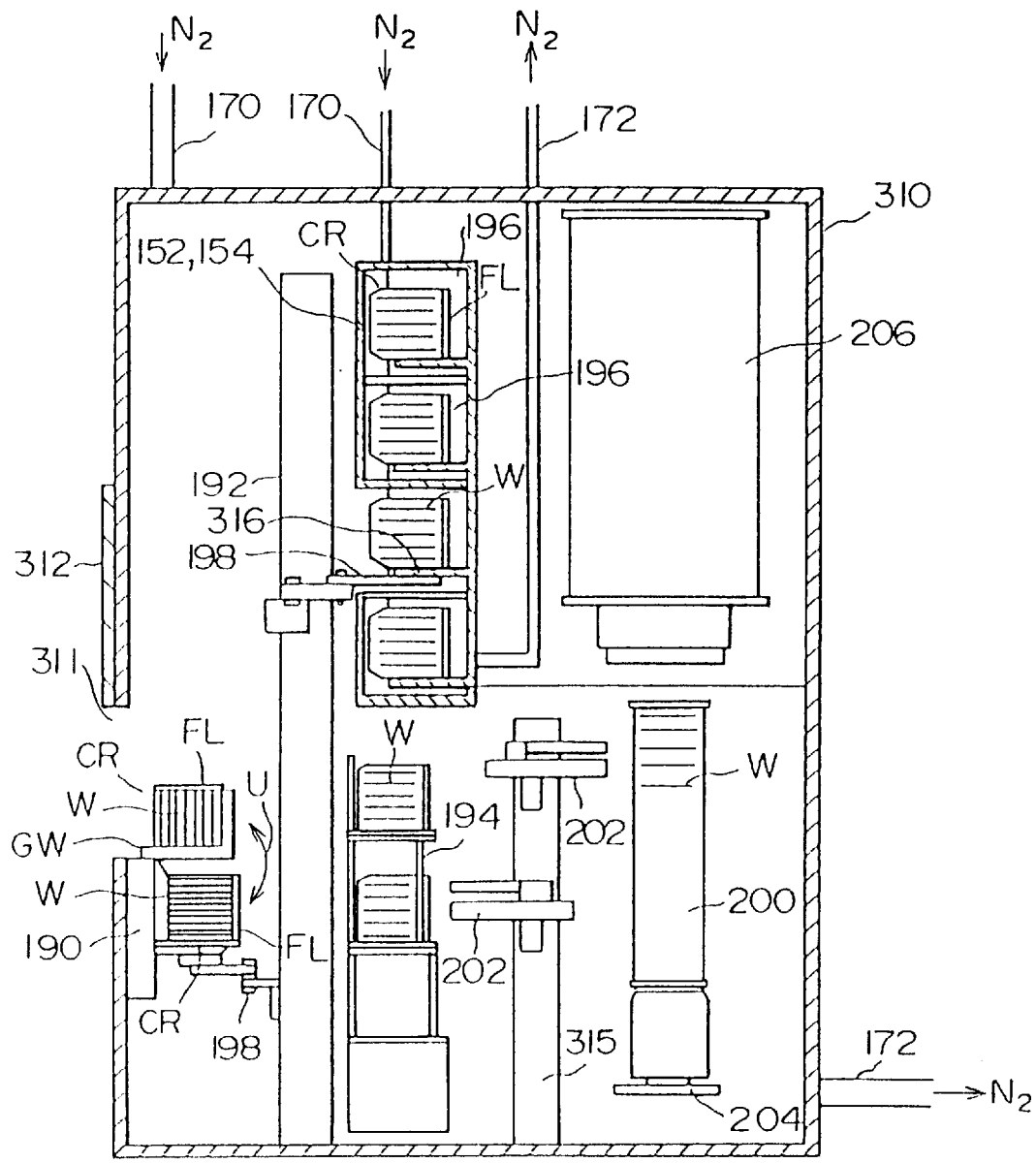
FIG. 12 is a side view schematically showing an example of the heat treatment apparatus of the embodiment.

FIG. 12 shows an example of each of the heat treatment apparatuses 10, 12, 14, and 16. Each heat treatment apparatus has a treatment chamber 310 which can be airtightly constructed. An opening 311 is formed on one side of the treatment chamber 310. A carrier CR is loaded to or unloaded from the opening 311. A wafer load/unload portion GW disposed on the front of the apparatus is provided with a carrier orientation changing portion 190. The carrier orientation changing portion 190 rotates the carrier CR by 90° so as to change the orientation thereof between a first orientation in which the flange portions FL are oriented upward and a second orientation in which the flanges portion FL are oriented sideway. In the first orientation, wafers W contained in the carrier CR are placed in upright position. In the second orientation, the wafers W contained in the carrier CR are placed nearly in flat position.

The treatment chamber 310 houses a heating furnace 206, a plurality of (for example, four) second carrier storage chambers 196, and a transfer stage 194. The heating furnace 206 heat-treats wafers W contained in a carrier CR. Each of the second carrier storage chambers 196 airtightly stores a carrier CR. The second carrier storage chambers 196 are vertically staged. A carrier elevator 192 is vertically disposed adjacent to the wafer load/unload portion GW in the treatment chamber 310. A carrier transfer 198 is disposed on the carrier elevator 192. The carrier transfer 198 transfers a carrier CR among the wafer load/unload portion GW, the transfer stage 194, and the second carrier storage chambers 196. A wafer transfer 202 is disposed behind the transfer stage 194. The wafer transfer 202 transfers the wafers W between a carrier CR on the transfer stage 194 and a wafer boat 200 disposed below the heating furnace 206. The wafer transfer 202 is disposed on a wafer elevator 315. The wafer boat 200 is loaded to or unloaded from the heating furnace 206 by the boat elevator 204.

An inert gas supply pipe 170 and an exhaust pipe 172 are connected to the treatment chamber 310 which is airtightly constructed. As with the case shown in FIG. 9, the inert gas supply pipe 170 and the exhaust pipe 172 are connected to the open/close devices 174 and 176, respectively. The open/close devices 174 and 176 are controlled by the stocker control device 178 corresponding to signals inputted from a $O_2$ concentration detector 180 disposed in the treatment chamber 310.

As described above, the four second carrier storage chambers 196 which are airtightly constructed are vertically staged. A holding shelf 316 is disposed within each of the second carrier storage chambers 196. The holding shelf 316 supports a carrier CR. The second carrier storage chamber 196 temporarily stores a carrier CR which contains the row wafers or the treated wafers. One side of each second carrier storage chamber 196 is open. This side faces the carrier elevator 192. As with the case shown in FIG. 9, the opening of each second carrier storage chamber is closed by a door 152 held by a pair of guides 154.

As described above, an inert gas supply pipe 170 and an exhaust pipe 172 are connected to each of the second carrier storage chambers 196. As with the case shown in FIG. 9, the inert gas supply pipe 170 and the exhaust pipe 172 are connected to open/close devices 174 and 176, respectively. The open/close devices 174 and 176 are adjusted by the stocker control device 178 corresponding to signals inputted from an $O_2$ concentration detector 180 disposed in each of the second carrier storage chambers 196.

In the above-described embodiment, the treatment chamber 310 and the second carrier storage chambers 196 were airtightly constructed. In addition, the inert gas supply pipe 170 and the exhaust pipe 172 are connected to each of the treatment chamber 310 and the second carrier storage chambers 196. However, either the treatment chamber 310 or the second carrier storage chambers 196 may be airtightly constructed. The inert gas supply pipe 170 and the exhaust pipe 172 may be connected to the chamber(s) which is airtightly constructed.

Figure 13:
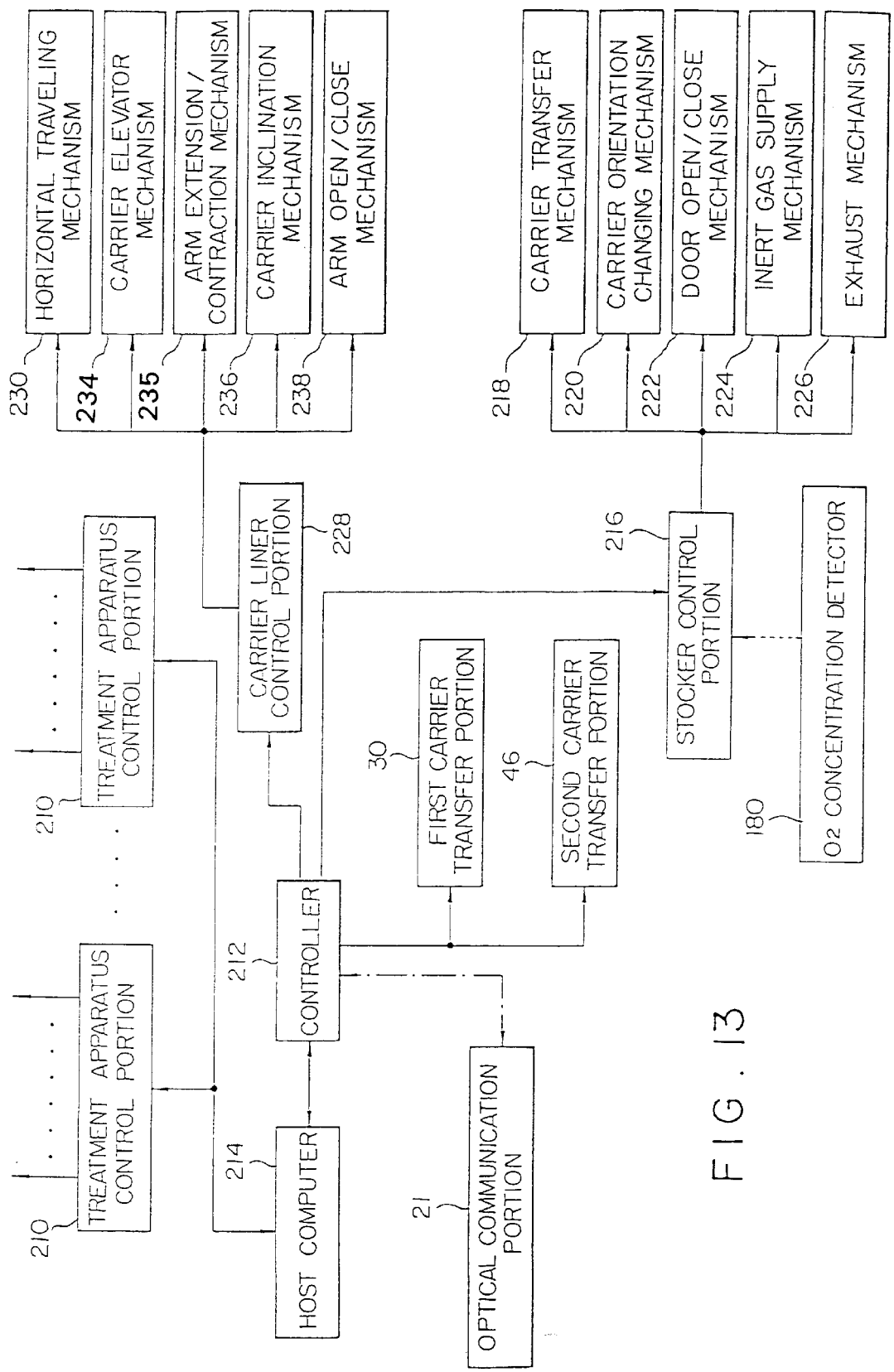
FIG. 13 is a block diagram showing an example of a control system of the embodiment.

FIG. 13 shows the construction of a control system of the heat treatment system. In this heat treatment system, treatment apparatus control portions 210 and a controller 212, which are local controllers 212, are connected to a host computer in parallel. The treatment apparatus control portions 210 control each portion of the heat treatment apparatuses 10, 12, 14, and 16. The controller 212 controls the operation of each portion of the stocker 18, the I/O station 20, and the carrier liner 22.

The controller 212 controls the first and second carrier transfer portions 30 and 46 at the I/O station 20 so that they transfer and rotate carriers CR between the first and second carrier load/unload positions 20a and 20b. In addition, the controller 212 exchanges signals with an external transfer robot through an optical communication portion 21. Moreover, the controller 212 causes a stocker control device 216 (equivalent to the stocker control device 178 shown in FIG. 9) to control each portion of the stocker 18 (such as a carrier transfer mechanism 218, a carrier orientation changing mechanism 220, a door open/close mechanism 222, a $N_2$ supply mechanism 224, and an exhaust mechanism 226).

Furthermore, the controller 212 causes a carrier liner control portion 228 to control each portion of the carrier liner 22 (such as a horizontal traveling mechanism 230, a carrier elevator mechanism 234, an arm expansion/retreat mechanism 235, a carrier inclination mechanism 236, and an arm open/close mechanism 238).

The above-described embodiment was the heat treatment system comprising the upright type heat treatment apparatuses. However, the present invention is not limited to such a system. Alternatively, the present invention can be applied to other type heat treatment systems. Generally, the present invention may be applied to any treatment system which transfers a carrier which contains planar workpieces such as wafers and LCD substrates.

As described above, according to the treatment system of the present invention, since carriers are stored in carrier storage chambers which are airtightly constructed and the carrier storage chambers are purged of gases therein by using an inert gas, the workpieces contained in the carriers can be prevented from being oxidized and deteriorated.

Next, with reference to FIGS. 15 to 19, another embodiment (a second embodiment) of the present invention will be described.

Figure 15:
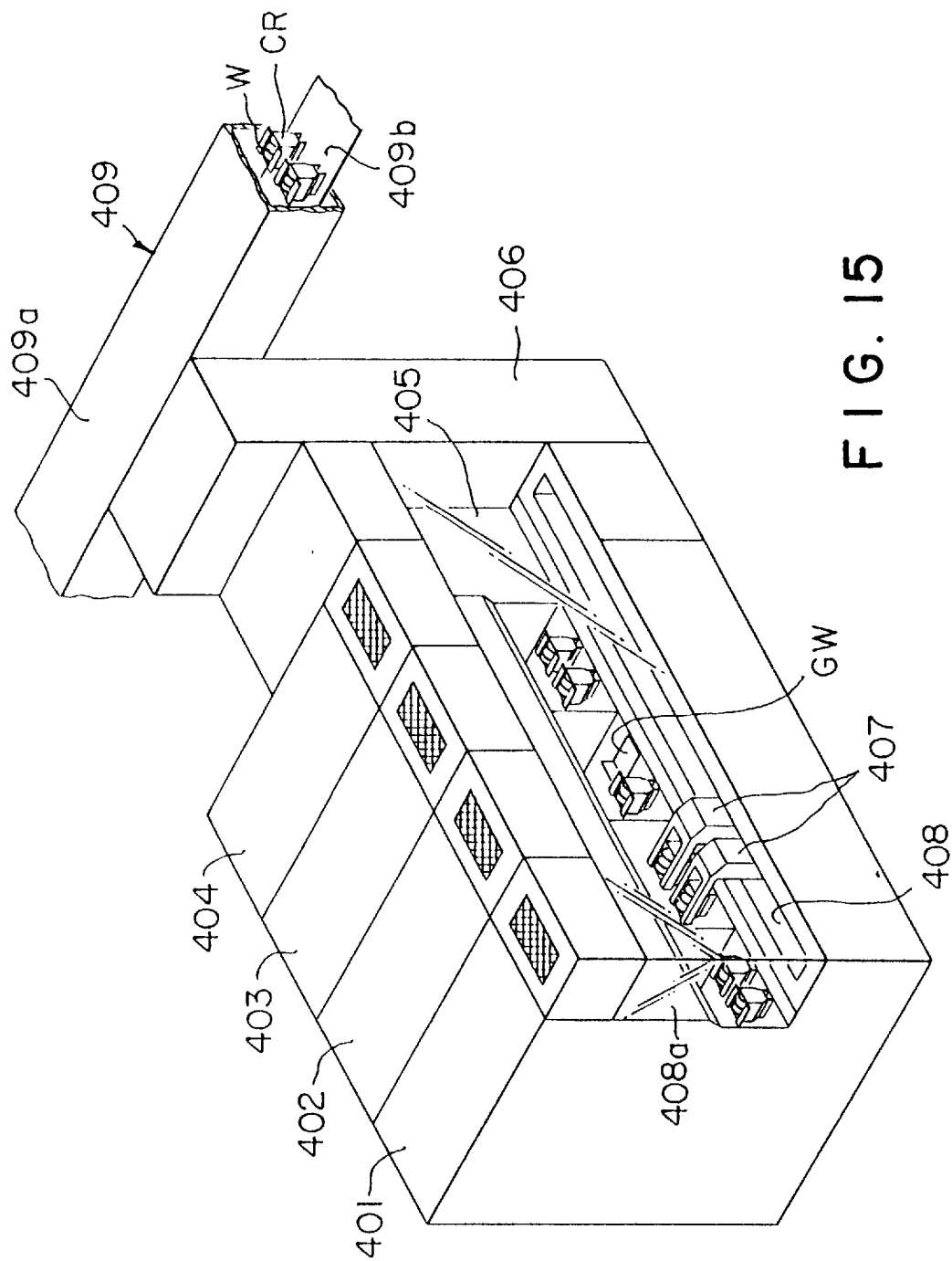
FIG. 15 is a perspective view showing a treatment system according to another embodiment of the present invention.

Referring to FIG. 15, a substrate treatment system of the present invention is shown. The substrate treatment system comprises a plurality of for example four upright type heat treatment apparatuses 401, 402, 403, and 404 which are disposed in line. An I/O station 405 and a carrier lifting apparatus 406 are disposed adjacent to (on the right of) the heat treatment apparatus 404 in a longitudinal direction. A transfer path 408 for a carrier liner 407 which transfers carriers CR is disposed along the treatment apparatuses 401, 402, 403, and 404. The transfer path 408 is housed in an air-tight chamber 408a. The transfer path 408, the air-tight chamber 408a, and the carrier liner 407 construct a carrier transfer apparatus.

The I/O station 405 has an air-tight chamber 405a. The air-tight chamber 405a is connected to the air-tight chamber 408a of the carrier transfer apparatus.

An inter-treatment conveying apparatus 409 is disposed at an upper lateral portion of the carrier lifting apparatus 406. The inter-treatment conveying apparatus 409 has for example a belt conveying means 409b disposed along a predetermined path. The belt conveying means 409b conveys the carriers CR among treatment apparatus. The belt conveying means 409b is housed in an air-tight chamber 409a. Each of the carriers CR can contain a plurality of semiconductor wafers W (for example, 25 semiconductor wafers W). The belt conveying means 409b can simultaneously convey two carriers CR which are perpendicular to the conveying direction. Accordingly, as will be described later, the carrier lifting apparatus 406, the carrier liner 407, and so forth can convey two carriers CR at a time.

Figure 17:
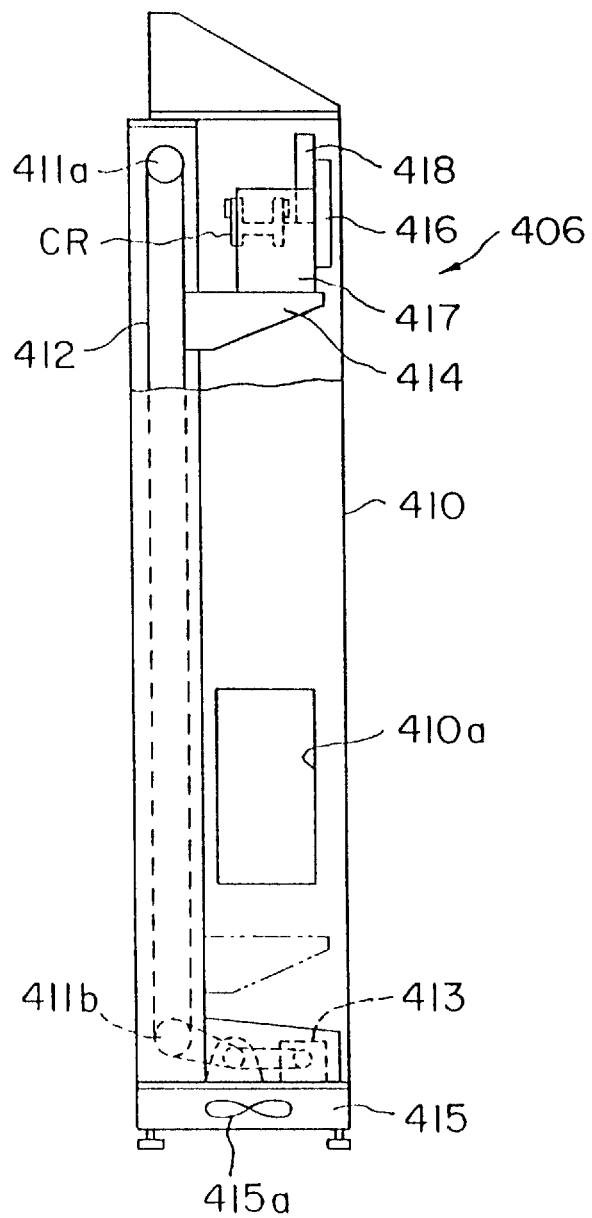
FIG. 17 is a front view showing a carrier lifting apparatus.
Figure 18:
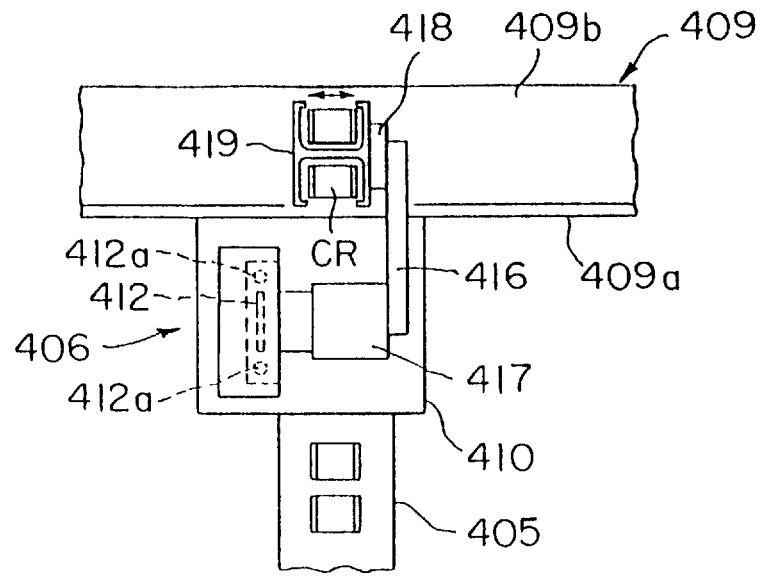
FIG. 18 is a plan view showing the carrier lifting apparatus.

Next, with reference to FIGS. 16A to 18, the construction of the carrier lifting apparatus 406 will be described. The carrier lifting apparatus 406 has a cylindrical housing (air-tight chamber) 410. As shown in FIG. 17, a lifting mechanism is disposed in the housing 410. The lifting mechanism consists of a rotating shaft 411a, a rotating shaft 411b, a belt 412, and a driving mechanism 413. The rotating shaft 411a is disposed at an upper end portion of the housing 410. The rotating shaft 411b is disposed at a lower end portion of the housing 410. A belt 412 is wound on between the rotating shafts 411a and 411b, and the driving mechanism 413 rotates the rotating shaft 411b. A base table 414 is fixed to the belt 412 of the lifting mechanism, and the driving mechanism 413 moves the belt 412 through the rotating shaft 411b, thereby lifting up and down the base table 414. As shown in FIG. 18, two rod-shaped guide 412a are disposed on both sides of the belt 412. The base table 414 is vertically moved and guided by the guides 412a through bearings (not shown).

Openings 410a are formed on a side wall of the housing 410 on the side of the air-tight chamber 409a and a side wall of the housing 410 on the side of the air-tight chamber 405a. Carrier holding arms 416, which will be described later, are taken in and out of the inside of the carrier lifting apparatus 406 through the openings 410a. As shown in FIG. 16A, a monitor window 410b is disposed on a side wall portion of the housing 410. A user can visually observe the inside of the carrier lifting apparatus 406 through the monitor window 410b. Thus, the air-tight chamber 409a of the inter-treatment conveying apparatus 409, the housing 410, the air-tight chamber 405a of the I/O station 405, and the air-tight chamber 408a of the carrier transfer apparatus are connected to each other and construct an air-tight space.

An air exhausting device 415 is disposed at a lower portion of the driving mechanism 413. The air exhausting device has a motor and a fan 415a. As shown in FIG. 16A, a clean gas supplying device 450 is disposed at an upper portion of the housing 410. The clean gas supplying device 450 has a fan 450a and a HEPA filter 450b. The clean gas supplying device 450 and the air exhausting device 415 always keep the inside of the housing 410 clean. Likewise, each of other air-tight chambers 409a, 408a, and 405a has a clean gas supplying device and an air exhausting device. Thus, the common air-tight space is totally kept clean.

An arm driving mechanism 417 is disposed on the base table 414. The arm driving mechanism 417 rotatably moves the carrier holding arm 416, and a carrier holding mechanism 418 is disposed at a distal end portion of the carrier holding arm 416.

In other words, as shown in FIGS. 16A and 16B, the carrier holding arm 416 is rotated by the arm driving mechanism 417 through a first rotating shaft 454. The carrier holding mechanism 418, which is disposed at the distal end portion of the carrier holding arm 416, is rotated through a second rotating shaft 456. The arm driving mechanism 417 has a fixed shaft 455 which is coaxial to the first rotating shaft 454. A belt 452 is wound on between the fixed shaft 455 and the second oscillating shaft 456. When the carrier holding arm 416 is rotated by the arm driving mechanism 417 through the first rotating shaft 454 by a predetermined angle α, the second rotating shaft 456 is also rotated by the belt wound on the fixed shaft 455 by the same angle as the angle α. Thus, the carrier holding mechanism 418 is always horizontally positioned by the belt 452 and the second rotating shaft 456. Thus, while the base table 414 is lifted up, the carrier holding mechanism 418 does not vibrate.

As shown in FIG. 18, the carrier holding mechanism 418 has a carrier holding portion 419 consisting of two opposed parts. When the carrier holding portion 419 is opened or closed as denoted by arrows of FIG. 18, the carrier holding portion 419 is engaged with a flange portion 460 (see FIG. 19) provided at an upper portion of a carrier CR. The carrier holding portion 419 can hold two carriers CR at a time.

After the carrier holding mechanism 418 holds two carriers CR, the arm driving mechanism 417 rotatably moves the carrier holding arm 416 on a substantially vertical plane so as to position the carriers CR just over the arm driving mechanism 417. In this condition, the driving mechanism 413 lifts up and down the base table 414.

In such a manner, the carrier lifting apparatus 406 conveys two carriers CR at a time between the inter-treatment conveying apparatus 409 and the I/O station 405. Thus, the inter-treatment conveying apparatus 409 conveys carriers CR among the treatment apparatus at a higher position in a clean room. In other words, unlike with the conventional manner, the carriers CR can be conveyed among the treatment apparatus without the intervention of workers and robots. Consequently, since semiconductor wafers W are less exposed to dust, the yield of the semiconductor wafers W can be improved. In addition, since the semiconductor wafers W are effectively conveyed among the treatment apparatus, the productivity of the semiconductor wafers can be improved. Moreover, since the inside of each of the air-tight chambers 409a, 408a, 405a and the housing 410 is always kept clean, the semiconductor wafers W can be conveyed while they are kept clean.

Next, the construction of the I/O station 405 will be described.

Figure 19:
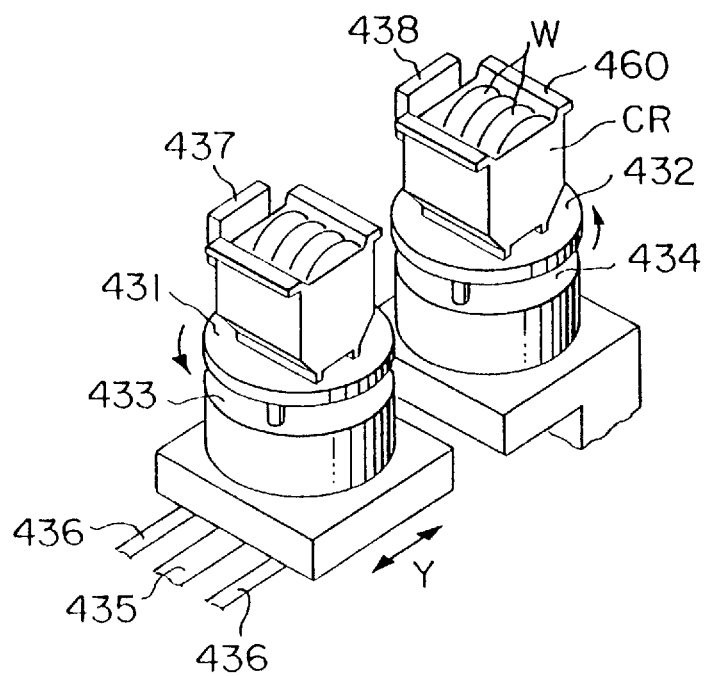
FIG. 19 is a perspective view showing an I/O station.

As shown in FIG. 19, the I/O station 405 has two carrier tables 431 and 432 on which carriers CR are positioned. The carrier tables 431 and 432 are rotated by turn tables 433 and 434, respectively. A belt driving mechanism is provided so as to change the distance between two carriers CR. The belt driving mechanism consists of for example a belt 435 and a liner guide, and the belt driving mechanism moves the turn table 433 in the Y direction represented by an arrow of FIG. 19. Optical reading mechanisms 437 and 438 are arranged on the rear side of the carrier tables 431 and 432, respectively. The optical reading mechanism 437 and 438 read identifications of carriers CR. The identifications are for example bar codes.

After the carrier lifting apparatus 406 puts two carriers CR, which have been conveyed from the inter-treatment conveying apparatus 409, on the carrier tables 431 and 432, a motor (not shown) rotates the belt 435 so as to widen the distance between the two carriers CR.

Thus, the two carriers CR can be prevented from interfering with each other. Next, the turn tables 433 and 434 are rotated. The optical reading mechanisms 437 and 438 read bar codes on the carriers CR. The data read by the optical reading mechanisms 437 and 438 are sent to a host computer (not shown) which totally controls the overall operations of the system.

Thereafter, the belt 435 is rotated and the distance between the two carriers CR is widened so that the carrier liner 407 can hold the two carriers CR.

Next, the construction and operation of the carrier liner 407 will be described. As shown in FIG. 15, the carrier liner 407 horizontally moves on the transfer path 408, which extends along the front sides of the heat treatment apparatuses 401 to 404 and the I/O station 405.

When the I/O station 405 receives carriers CR, the carrier liner 407 conveys the carriers CR to one of the heat treatment apparatuses 401 to 404 according to an instruction information received from the host computer, which totally controls the overall operations of the system. In the heat treatment system according to this embodiment, the carrier liner 407 is of a dual head type. Thus, the carrier liner 407 can convey two carriers CR at a time.

As was described above, according to the aforementioned embodiment, semiconductor wafers W can be conveyed among treatments without the need to use mobile conveying robots, manual operations of workers, and so forth. In addition, since the semiconductor wafers W are less exposed to dust, the yield and productivity of the semiconductor wafers W can be improved.

In the aforementioned embodiment, the present invention was applied to a system with upright type heat treatment apparatuses. However, it should be appreciated that the present invention is not limited to such a system. Instead, the present invention may be applied to any substrate treatment system that conveys semiconductor wafers, LCD substrates, or the like while they are contained in carriers.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A treatment system, comprising:
    a treatment apparatus for performing a treatment for planar workpieces contained in carriers; and
    a first air-tight carrier storage chamber for storing said carriers,
    wherein said treatment apparatus comprises:
        a treatment chamber;
        a furnace disposed in said treatment chamber and adapted for heat-treating the planar workpieces contained in said carriers;
        second air-tight carrier storage chambers disposed in said treatment chamber and adapted for storing said carriers;
    a means for loading and unloading said carriers into said treatment chamber;
    a transfer stage disposed within said treatment chamber and adapted for holding said carriers to allow said workpieces to be removed for heat-treating by said furnace;
    a carrier elevator disposed within said treatment chamber for transferring said carriers between said loading/unloading means, said second air-tight carrier storage chambers, and said transfer stage;
    gas supply means for supplying an inert gas to said second air-tight storage chambers; and
    gas exhaust means for exhausting a gas from said second air-tight carrier storage chambers, and
    wherein said second air-tight carrier storage chambers are arranged in a multi-stage manner, each second air-tight carrier storage chamber having an opening, a pair of guides disposed at said opening and an independently operable door between said pair of guides for opening and closing said opening.

2. A treatment system comprising:
    a treatment apparatus for performing a treatment for planar workpieces contained in carriers; and
    a first air-tight carrier storage chamber for storing said carriers,
    wherein said treatment apparatus comprises:
        an air-tight treatment chamber;
        a furnace disposed in said treatment chamber and adapted for heat-treating the planar workpieces contained in said carriers;
        second carrier storage chambers disposed in said treatment chamber and adapted for storing said carriers;
        a means for loading and unloading said carriers into said treatment chamber;
        a transfer stage disposed within said treatment chamber and adapted for holding said carriers to allow said workpieces to be removed for heat-treating by said furnace;
        a carrier elevator disposed within said treatment chamber for transferring said carriers between said loading/unloading means, said second carrier storage chambers, and said transfer stage;
        a carrier elevator disposed within said treatment chamber for transferring said carriers between said loading/unloading means, said second carrier storage chambers, and said transfer stage;
        gas supply means for supplying an inert gas to said treatment chamber; and
        gas exhaust means for exhausting a gas from said treatment chamber, and
        wherein said second carrier storage chambers are arranged in a multi-stage manner, each second carrier storage chamber having an opening, a pair of guides disposed at said opening and an independently operable door between said pair of guides for opening and closing said opening.

3. A treatment apparatus for performing a treatment for planar workpieces contained in carriers, said treatment apparatus comprising:
    a treatment chamber;
    a furnace disposed in said treatment chamber and adapted for heat-treating the workpieces contained in the carriers;
    air-tight carrier storage chambers disposed in said treatment chamber and adapted for storing the carriers;
    a means for loading and unloading said carriers into said treatment chamber;
    a transfer stage disposed within said treatment chamber and adapted for holding said carriers to allow said workpieces to be removed for heat-treating by said furnace;
    a carrier elevator disposed within said treatment chamber for transferring said carriers between said loading/unloading means, said air-tight carrier storage chambers, and said transfer stage;

gas supply means for supplying an inert gas to said air-tight carrier storage chambers; and gas exhaust means for exhausting a gas from said air-tight carrier storage chambers, wherein said air-tight carrier storage chambers are arranged in a multi-stage manner, each air-tight carrier storage chamber having an opening, a pair of guides disposed at said opening and an independently operable door between said pair of guides for opening and closing said opening.

4. The treatment apparatus as set forth in claim 3, wherein said air-tight carrier storage chambers each have a holding shelf for holding one carrier therewith.

5. The treatment apparatus as set forth in claim 3, wherein one pair of guides are adapted to move in a direction perpendicular to each opening of said air-tight carrier storage chambers so as to move said planar door from or to said opening.

6. The treatment apparatus as set forth in claim 3, wherein said gas supply means includes:
  a gas supply source;
  an inert gas supply pipe for connecting said gas supply source and said air-tight carrier chambers; and
  an open/close device disposed on said inert gas supply pipe,
  wherein said gas exhaust means includes:
    a plurality of exhaust pipes each having a first end and a second end, said first end being connected to one of said carrier chambers, said second end being open; and
    an open/close device disposed on said exhaust pipe, and
    wherein an oxygen concentration detector is connected to each carrier storage chamber, and a stocker control device is connected to each oxygen concentration detector and adapted for adjusting the open/close device of said gas supply means and the open/close device of said exhaust means.

7. A treatment apparatus for performing a treatment for planar workpieces contained in carriers, said treatment apparatus comprising:

an air-tight treatment chamber;

a furnace disposed in said treatment chamber and adapted for heat-treating the workpieces contained in the carriers;

carrier storage chambers disposed in said treatment chamber and adapted for storing the carriers;

a means for loading and unloading said carriers into said treatment chamber;

a transfer stage disposed within said treatment chamber and adapted for holding said carriers to allow said workpieces to be removed for heat-treating by said furnace;

a carrier elevator disposed within said treatment chamber for transferring said carriers between said loading/unloading means, said carrier storage chambers, and said transfer stage;

gas supply means for supply an inert gas to said air-tight treatment chamber; and gas exhaust means for exhausting a gas from said treatment chamber, wherein said carrier storage chambers are arranged in a multi-stage manner, each carrier storage chamber having an opening, a pair of guides disposed at the opening and an independently operable door between the pair of guides for opening and closing the opening.

8. The treatment apparatus as set forth in claim 7, wherein said gas supply means includes:
  a gas supply source;
  an inert gas supply pipe for connecting said gas supply source and said air-tight treatment chamber; and
  an open/close device disposed on said inert gas supply pipe,
  wherein said gas exhaust means includes:
    an exhaust pipe having a first end and a second end, said first end being connected to said air-tight treatment chamber, said second end being open; and
    an open/close device disposed on said exhaust pipe, and
    wherein an oxygen concentration detector is connected to said air-tight treatment chamber, and a stocker control device is connected to said oxygen concentration detector and adapted for adjusting the open/close device of said gas supply means and the open/close device of said gas exhaust means.

* * * * *